US012777976B2

(12) United States Patent
Zhou

(10) Patent No.: US 12,777,976 B2
(45) Date of Patent: Oct. 27, 2026

(54) TRANSFER SUBSTRATE, METHOD FOR TRANSFERRING MICRODEVICE AND DISPLAY PANEL

(71) Applicant: TIANMA ADVANCED DISPLAY TECHNOLOGY INSTITUTE (XIAMEN) CO., LTD., Xiamen (CN)

(72) Inventor: Gufan Zhou, Xiamen (CN)

(73) Assignee: TIANMA ADVANCED DISPLAY TECHNOLOGY INSTITUTE (XIAMEN) CO., LTD., Xiamen (CN)

( * ) Notice: Subject to any disclaimer, the term of this patent is extended or adjusted under 35 U.S.C. 154(b) by 616 days.

(21) Appl. No.: 18/321,742

(22) Filed: May 22, 2023

(65) Prior Publication Data

US 2023/0326910 A1 Oct. 12, 2023

(30) Foreign Application Priority Data

Jan. 17, 2023 (CN) ......................... 202310077628.0

(51) Int. Cl.
*H10W 90/00* (2026.01)
*H10H 20/01* (2025.01)

(52) U.S. Cl.
CPC ............ *H10W 90/00* (2026.01); *H10H 20/01* (2025.01)

(58) Field of Classification Search
CPC . H01L 25/0753; H01L 21/6835; H10H 20/01; H10H 20/018; H10H 20/85; H10H 20/036
See application file for complete search history.

(56) References Cited

U.S. PATENT DOCUMENTS

2013/0130440 A1* 5/2013 Hu .......................... H01L 24/83 438/107
2017/0345692 A1* 11/2017 Liu ...................... H05K 13/082
2019/0259907 A1* 8/2019 Bibl ...................... H10H 20/812
2020/0013662 A1* 1/2020 Chaji .................. H01L 21/6835
2020/0020825 A1* 1/2020 Yang .................... H10H 20/825
2020/0220042 A1* 7/2020 Ahn .................... H10H 20/8586
2021/0143045 A1* 5/2021 Wang ................ H01L 21/67144
2021/0384051 A1* 12/2021 Katz ................. H01L 21/67132
2022/0216076 A1* 7/2022 Halbritter ......... H01L 21/67144
2023/0107245 A1* 4/2023 Marinov ............. H01L 21/6835 438/107

* cited by examiner

*Primary Examiner* — Ismail A Muse
(74) *Attorney, Agent, or Firm* — Kilpatrick Townsend & Stockton LLP

(57) ABSTRACT

A transfer substrate, a method for transferring a microdevice and a display panel are provided. The transfer substrate includes a substrate body, a first functional layer and a second functional layer. Protrusions and grooves are alternately formed on one side of the substrate body. The first functional layer is arranged on the side of the substrate body where the protrusion is formed. The first functional layer at least partially overlaps the protrusion along a direction perpendicular to a plane in which the substrate body extends. The second functional layer at least partially overlaps the first functional layer along the direction perpendicular to the plane in which the substrate body extends. The second functional layer extends from the protrusion to at least a sidewall of the groove.

20 Claims, 35 Drawing Sheets

K-K'

A-A'

D-D'

TRANSFER SUBSTRATE, METHOD FOR TRANSFERRING MICRODEVICE AND DISPLAY PANEL

The present application claims priority to Chinese Patent Application No. 202310077628.0, titled "TRANSFER SUBSTRATE, METHOD FOR TRANSFERRING MICRODEVICE AND DISPLAY PANEL", filed on Jan. 17, 2023 with the China National Intellectual Property Administration, which is incorporated herein by reference in its entirety.

FIELD

The present disclosure relates to the field of display technologies, and in particular to a transfer substrate, a method for transferring a microdevice and a display panel.

BACKGROUND

A light emitting diode (LED) is a semiconductor element that emits light of a specific wavelength range when current flows through it. The light emitting diode releases energy in the form of photons based on the energy difference of electrons moving between an n-type semiconductor and a p-type semiconductor, and therefore is called a cold light source. Light emitting diodes have advantages of low power consumption, small size, high brightness, and high reliability as well as are easy to match with integrated circuits, and thus are widely used as light sources. Moreover, Mini LED (sub-millimeter LED) displays or Micro LED displays that consist of LEDs directly serving as self-luminating pixel elements are increasingly used as the LED technology matures.

However, there are various difficulties in Micro-LED displays, especially with respect to the mass transfer. Stamp-based mass transfer and laser-based mass transfer have attracted more attention currently, having their respective advantages. The laser-based mass transfer is easier when transferring Micro-LEDs selectively, while the stamp-based mass transfer is more mature and has fewer bottlenecks. However, the stamp-based mass transfer and the laser-based mass transfer also have their respective disadvantages. For example, a receiving substrate for the laser-based mass transfer necessarily has a degree of elasticity and viscosity to avoid problems such as displacement that easily occurs when the chip falls, and it is difficult for the stamp-based mass transfer to transfer Micro-LEDs selectively.

SUMMARY

In view of this, a transfer substrate, a method for transferring a microdevice and a display panel are provided according to the present disclosure.

A transfer substrate is provided according to one embodiment of the present disclosure. The transfer substrate includes: a substrate body, a first functional layer and a second functional layer. A side of the substrate body is provided with a protrusion and a groove, and the protrusion alternates with the groove. The first functional layer is arranged on the side of the substrate body where the protrusion is provided, the first functional layer at least partially overlaps the protrusion along a direction perpendicular to a plane in which the substrate body extends. The second functional layer is arranged on a side of the first functional layer away from the substrate body, the second functional layer at least partially overlaps the first functional layer along the direction perpendicular to the plane in which the substrate body extends, and the second functional layer at least extends from the protrusion to a sidewall of the groove.

A method for transferring a microdevice is provided according to another embodiment of the present disclosure. The method is applied to a transfer substrate and a target substrate. The target substrate is arranged opposite to the transfer substrate. The transfer substrate includes a substrate body, a first functional layer and a second functional layer. A side of the substrate body is provided with a protrusion and a groove, and the protrusion alternates with the groove. The first functional layer is arranged on the side of the substrate body where the protrusion is provided, and the first functional layer at least partially overlaps the protrusion along a direction perpendicular to a plane in which the substrate body extends. The second functional layer is arranged on a side of the first functional layer away from the substrate body, the second functional layer at least partially overlaps the first functional layer along the direction perpendicular to the plane in which the substrate body extends, and the second functional layer at least extends from the protrusion to a sidewall of the groove. The method includes: attaching the microdevice to a side of the second functional layer away from the first functional layer corresponding to the protrusion, where the first functional layer is in a first state and has a volume of V1; applying, from a side of the substrate body away from the microdevice, laser to the first functional layer corresponding to the protrusion to switch a state of the first functional layer to a second state, where the volume of the first functional layer in the second state is V2, V2 is greater than V1, and the second functional layer protrudes towards a side away from the protrusion; and releasing the microdevice from the transfer substrate and transferring the microdevice to the target substrate.

Based on the embodiments, a display panel is also provided according to the present disclosure. The display panel includes a substrate and multiple microdevices arranged on one side of the substrate. The microdevices are transferred onto the substrate by: attaching the microdevices to a side of the second functional layer away from the first functional layer corresponding to the protrusion, where the first functional layer is in a first state and has a volume of V1; applying, from a side of the substrate body away from the microdevices, laser to the first functional layer corresponding to the protrusion to switch a state of the first functional layer to a second state, where the volume of the first functional layer in the second state is V2, V2 is greater than V1, and the second functional layer protrudes towards a side away from the protrusion; and releasing the microdevices from the transfer substrate and transferring the microdevices to the target substrate.

It should be understood that a product implementing the present disclosure may not achieve all the effects described above at the same time.

Embodiments of the present disclosure will become apparent through the following detailed description of embodiments of the present disclosure with reference to the drawings.

BRIEF DESCRIPTION OF THE DRAWINGS

The drawings, which are incorporated in and constitute a part of this specification, illustrate the embodiments of the disclosure and together with the detail description serve to explain the principles of the present disclosure.

DETAILED DESCRIPTION

Various illustrative embodiments of the present disclosure are described in detail with reference to the drawings. It should be noted that relative arrangements of components and steps, numerical expressions and numerical values set forth in these embodiments do not limit the scope of the present disclosure unless specifically stated otherwise.

The following description of at least one embodiment is merely illustrative in nature rather than intended as any limitation of the present disclosure, its application or uses.

Some techniques, methods and devices may not be discussed in detail. However, such techniques, methods and devices should be considered part of the description where appropriate.

All the values throughout the examples shown and discussed herein should be construed to be illustrative rather than restrictive. Therefore, other examples of the illustrative embodiment may have different values.

It should be noted that like numerals and letters denote like items throughout the drawings. Therefore, an item, once defined in one figure, is not further defined in subsequent figures.

Figure 1:
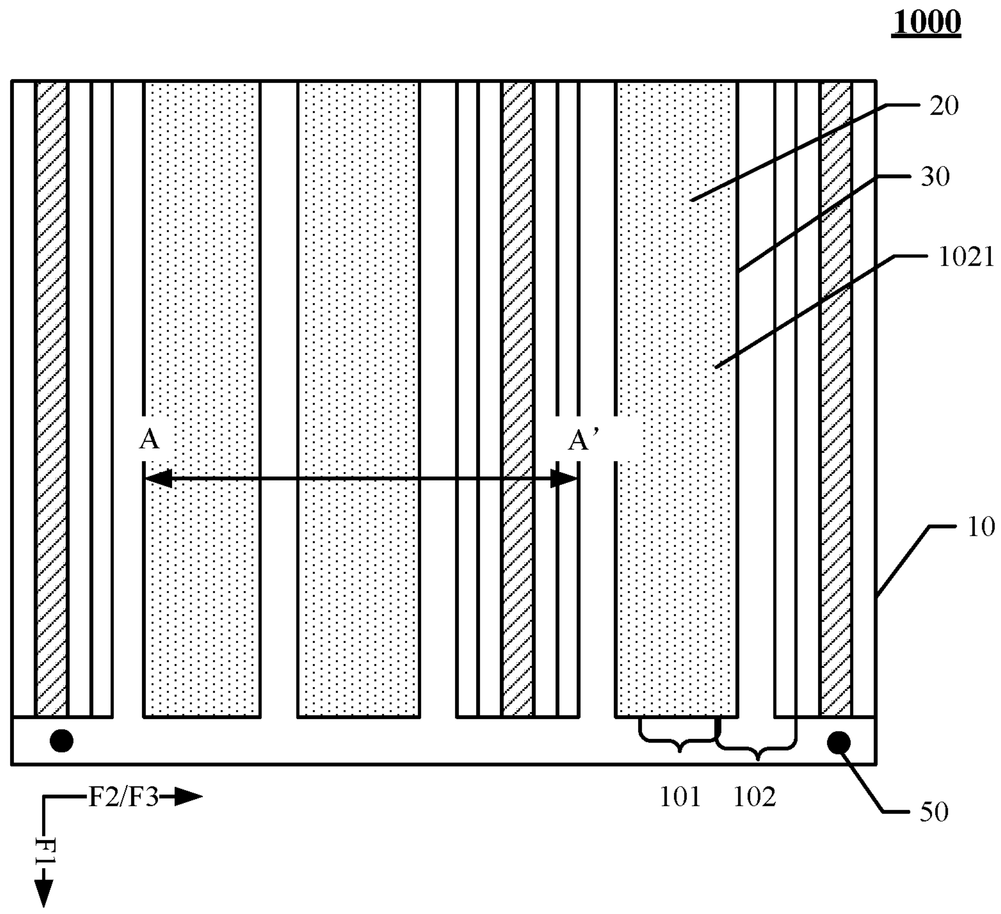
FIG. 1 is a plan view of a transfer substrate according to an embodiment of the present disclosure.
Figure 2:
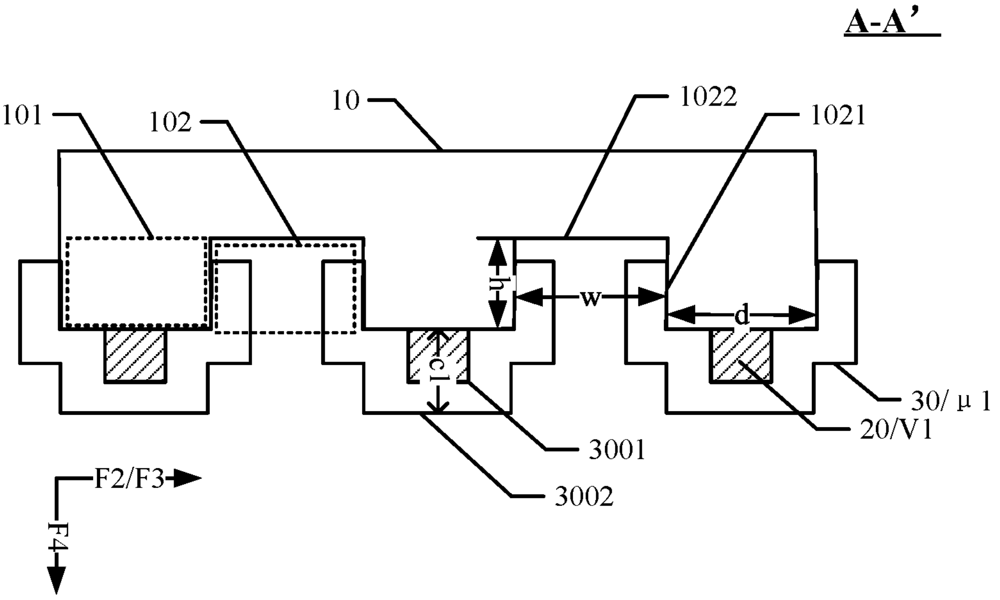
FIG. 2 is a cross-sectional view of the transfer substrate along an A-A' line in FIG. 1.
Figure 3:
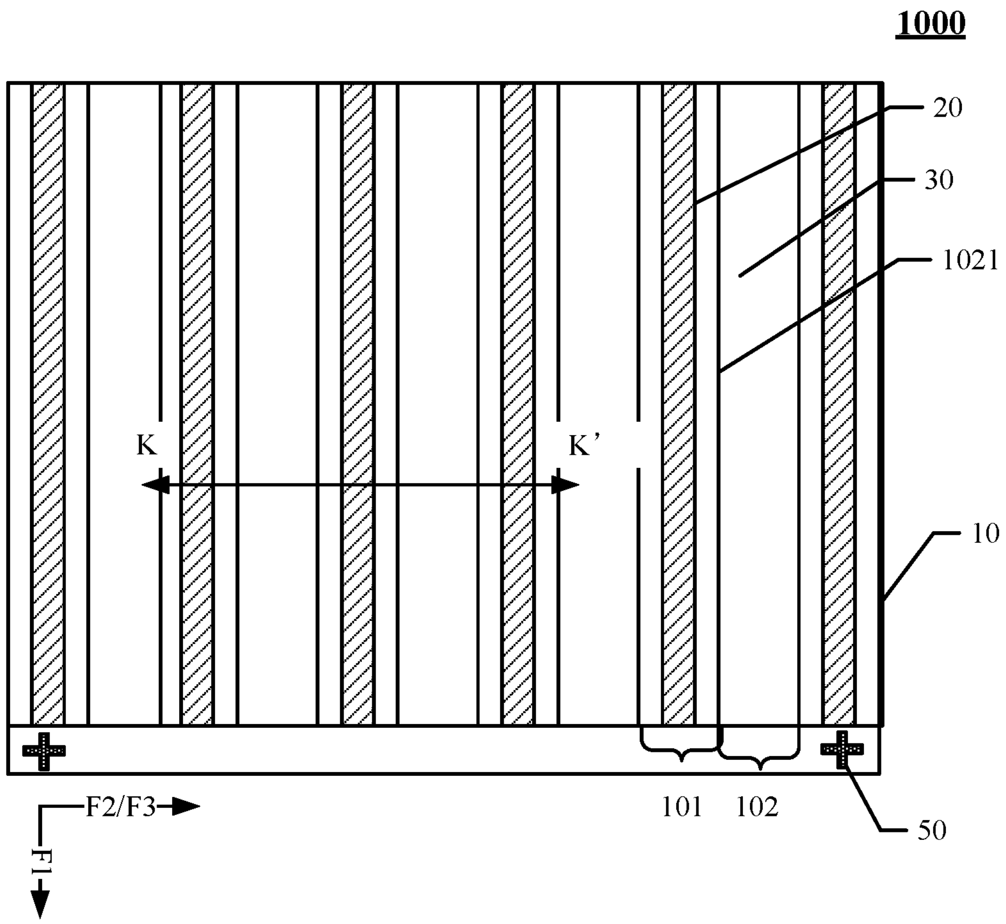
FIG. 3 is a plan view of the transfer substrate according to another embodiment of the present disclosure.
Figure 4:
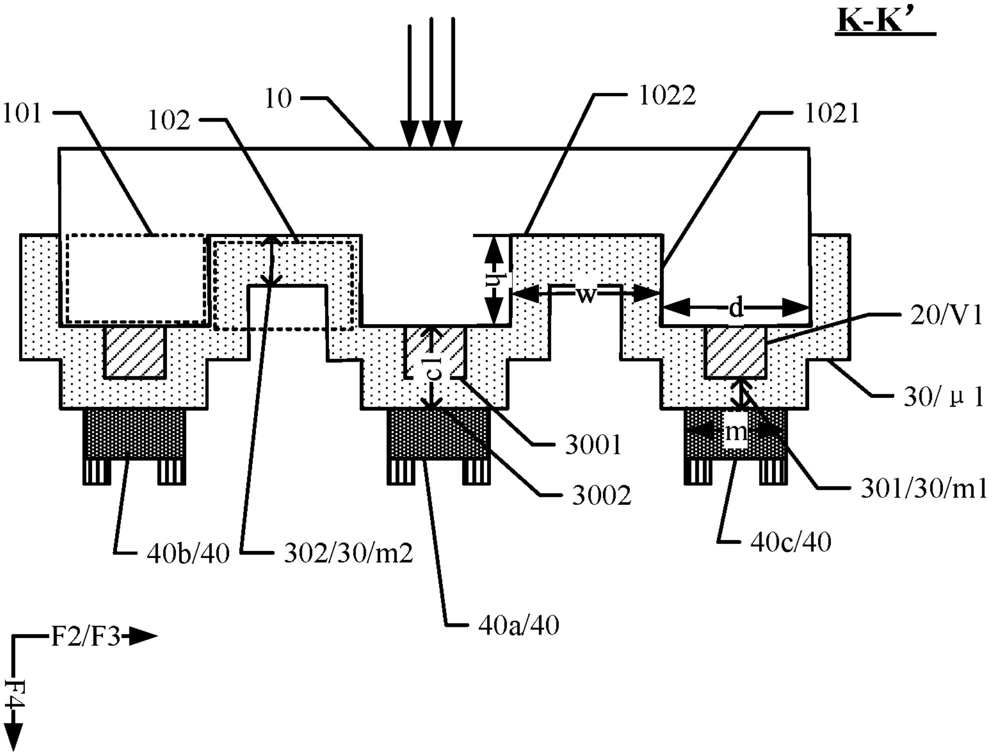
FIG. 4 is a cross-sectional view of the transfer substrate along a K-K' line in FIG. 3.
Figure 5:
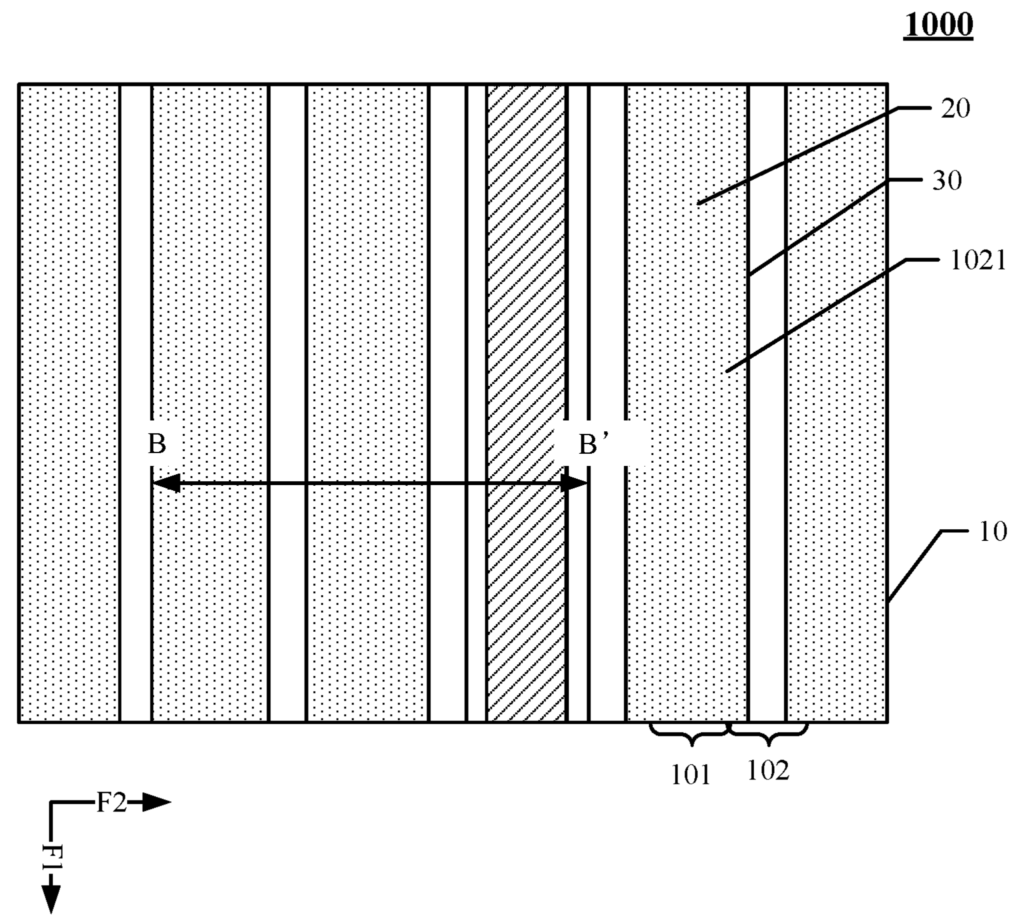
FIG. 5 is a plan view of the transfer substrate according to another embodiment of the present disclosure.
Figure 6:
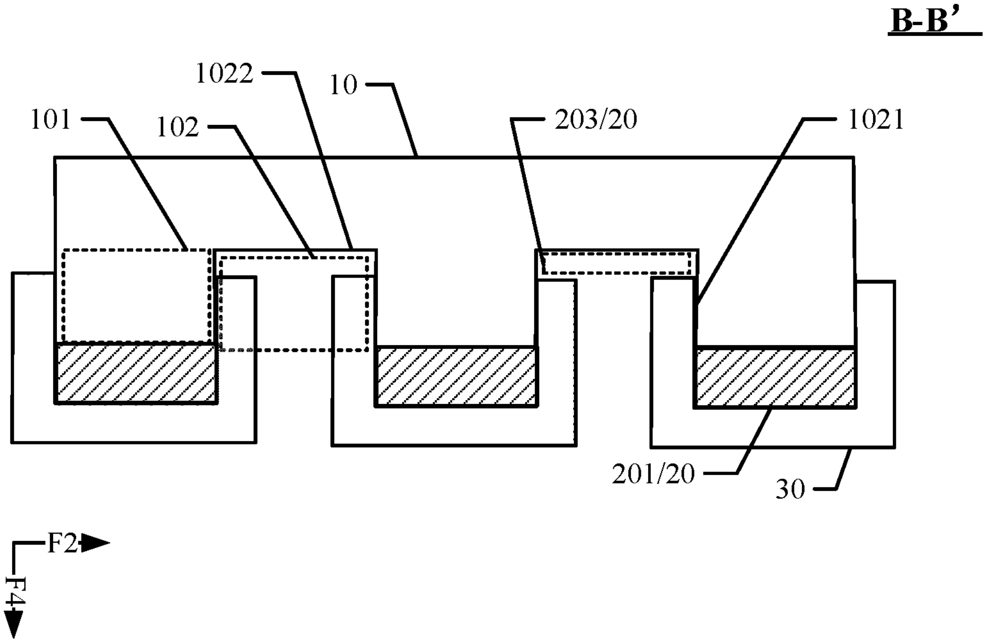
FIG. 6 is a cross-sectional view of the transfer substrate along a B-B' line in FIG. 5.
Figure 7:
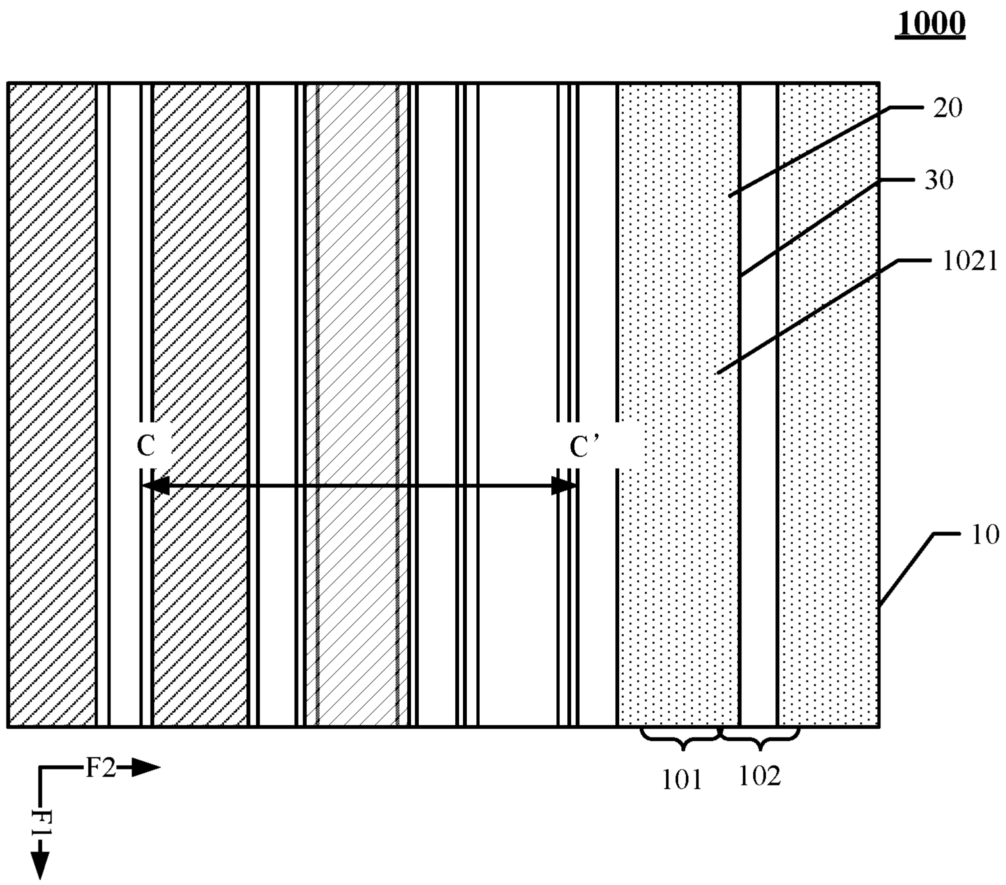
FIG. 7 is a plan view of the transfer substrate according to another embodiment of the present disclosure.
Figure 8:
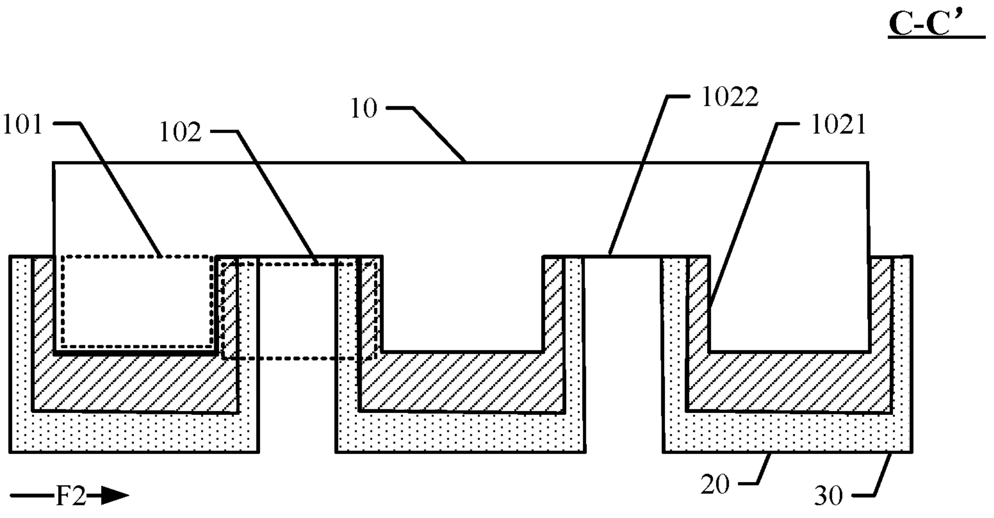
FIG. 8 is a cross-sectional view of the transfer substrate along a C-C' line in FIG. 7.
Figure 9:
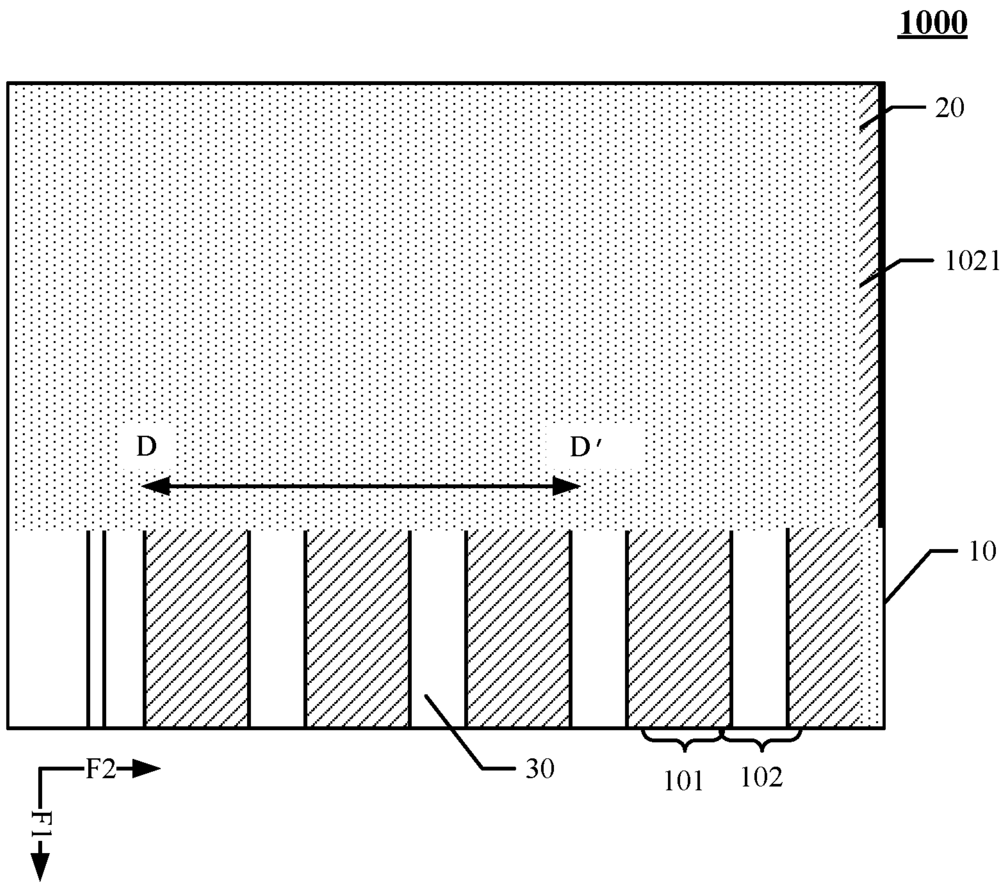
FIG. 9 is a plan view of the transfer substrate according to another embodiment of the present disclosure.

Reference is made to FIG. 1 to FIG. 15 and FIG. 17. FIG. 1 is a plan view of a transfer substrate according to an embodiment of the present disclosure. FIG. 2 is a cross-sectional view of the transfer substrate along an A-A' line in FIG. 1. FIG. 3 is a plan view of the transfer substrate according to another embodiment of the present disclosure. FIG. 4 is a cross-sectional view of the transfer substrate along a K-K' line in FIG. 3. FIG. 5 is a plan view of the transfer substrate according to another embodiment of the present disclosure. FIG. 6 is a cross-sectional view of the transfer substrate along a B-B' line in FIG. 5. FIG. 7 is a plan view of the transfer substrate according to another embodiment of the present disclosure. FIG. 8 is a cross-sectional view of the transfer substrate along a C-C' line in FIG. 7. FIG. 9 is a plan view of the transfer substrate according to another embodiment of the present disclosure. FIG. is a cross-sectional view of the transfer substrate along a D-D' line in FIG. 9. FIG. 11 is a plan view of the transfer substrate according to another embodiment of the present disclosure.

Figure 11:
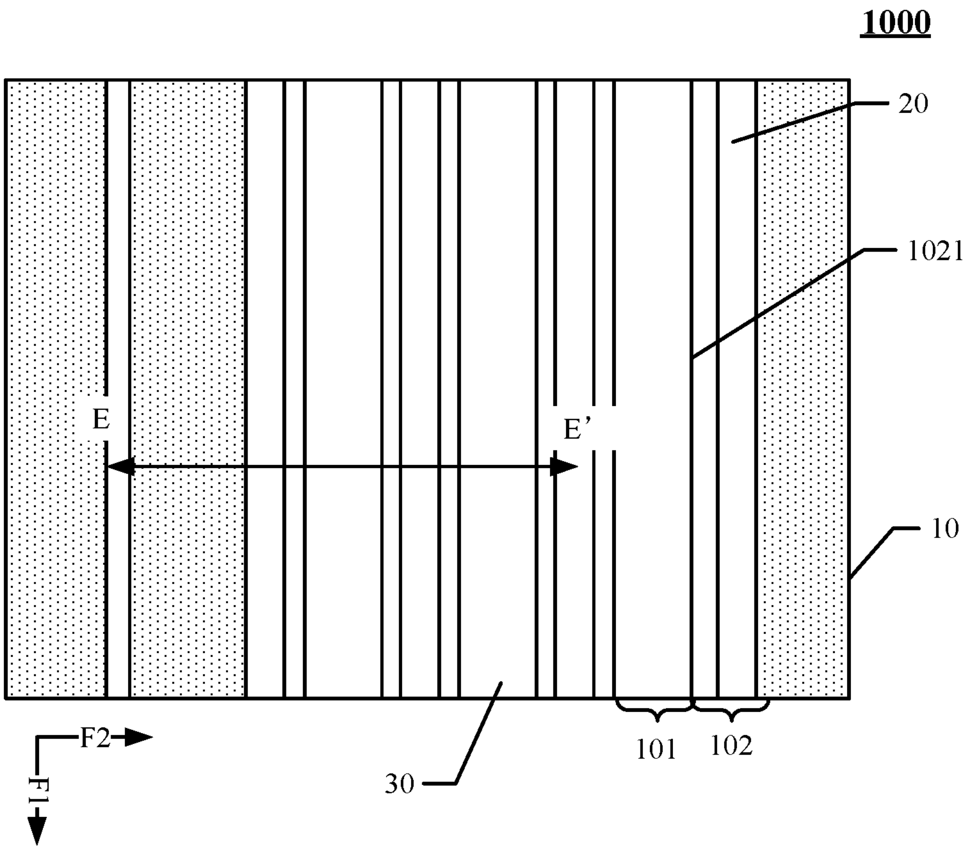
FIG. 11 is a plan view of the transfer substrate according to another embodiment of the present disclosure.
Figure 12:
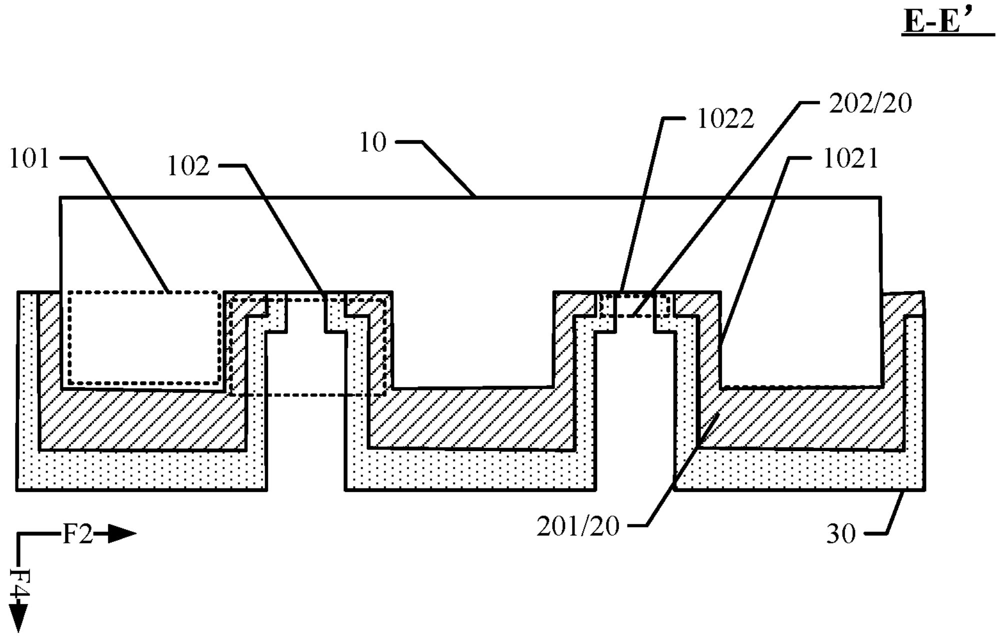
FIG. 12 is a cross-sectional view of the transfer substrate along an E-E' line in FIG. 11.
Figure 13:
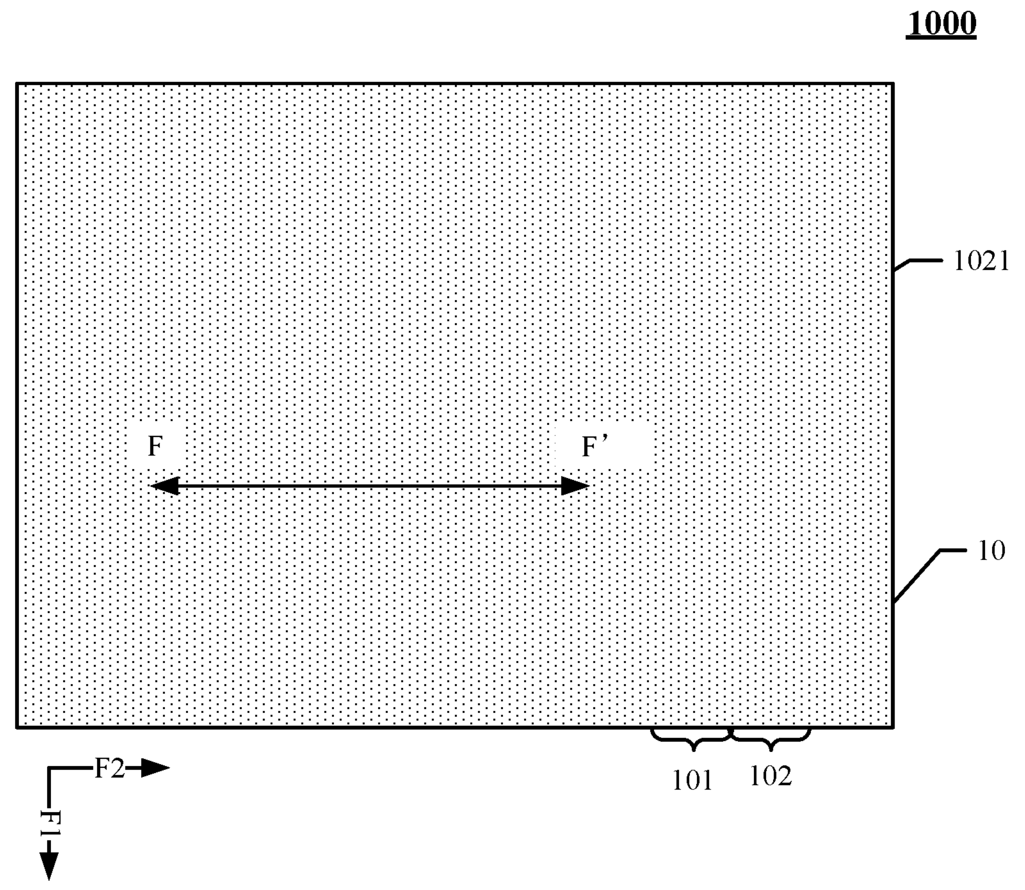
FIG. 13 is a plan view of the transfer substrate according to another embodiment of the present disclosure.
Figure 14:
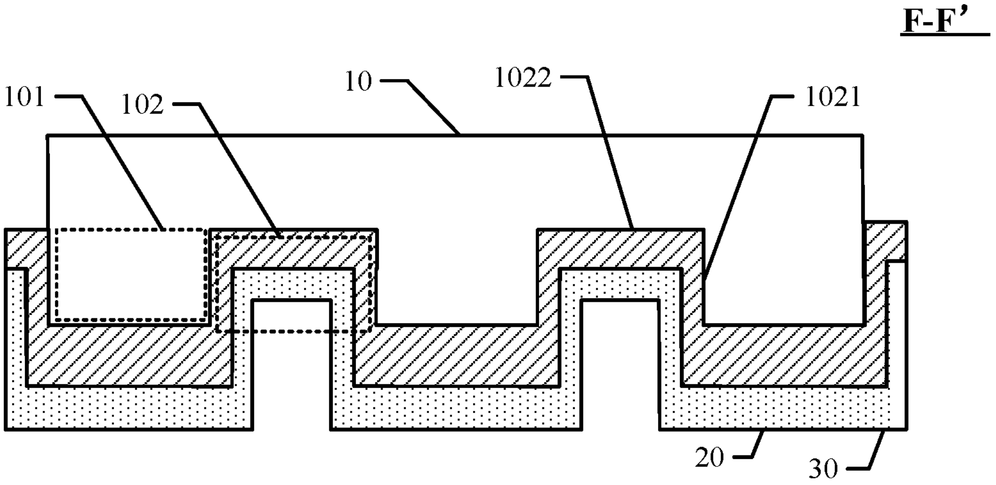
FIG. 14 is a cross-sectional view of the transfer substrate along an F-F' line in FIG. 13.
Figure 15:
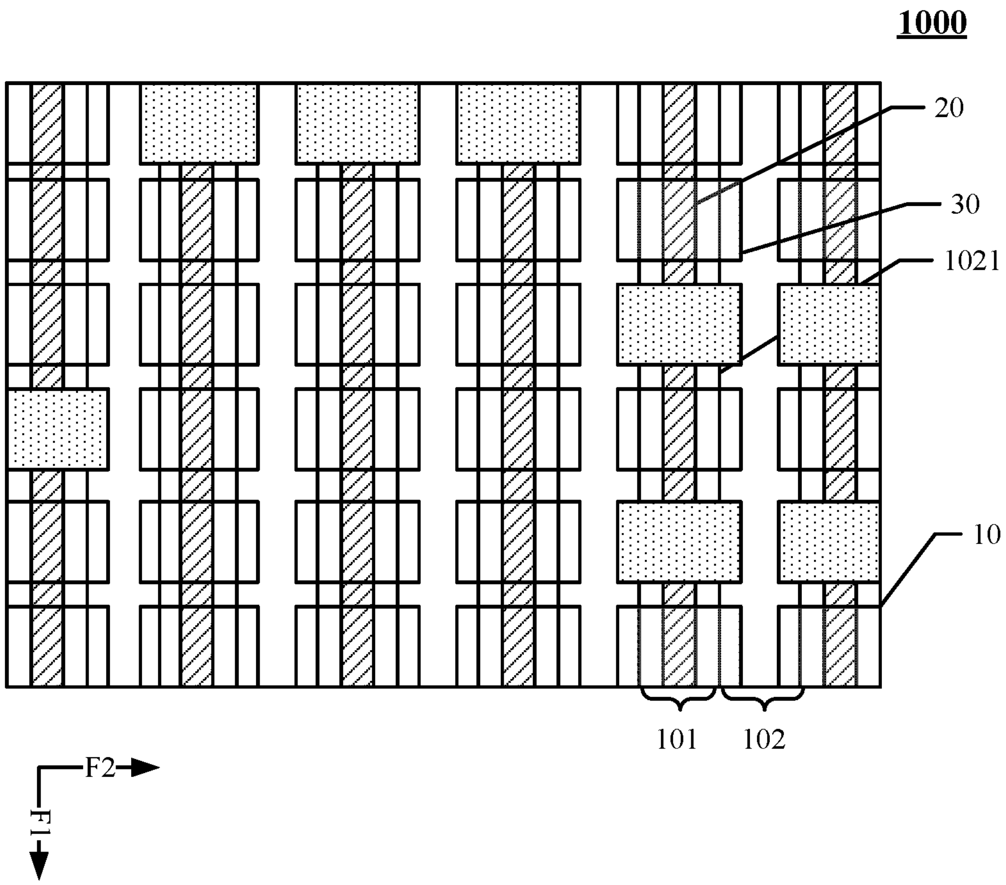
FIG. 15 is a plan view of the transfer substrate according to another embodiment of the present disclosure.
Figure 17:
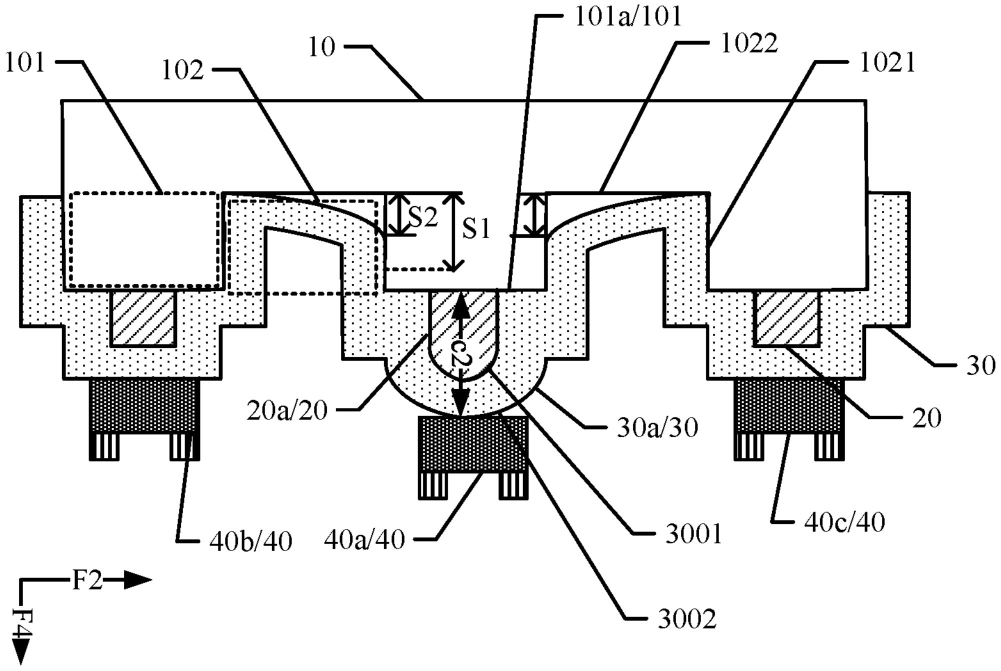
FIG. 17 is a cross-sectional view of the transfer substrate along a K-K' line in FIG. 3 according to another embodiment.

FIG. 12 is a cross-sectional view of the transfer substrate along an E-E' line in FIG. 11. FIG. 13 is a plan view of the transfer substrate according to another embodiment of the present disclosure. FIG. 14 is a cross-sectional view of the transfer substrate along an F-F' line in FIG. 13. FIG. 15 is a plan view of the transfer substrate according to another embodiment of the present disclosure. FIG. 17 is a cross-sectional view of the transfer substrate along a K-K' line in FIG. 3 according to another embodiment.

The transfer substrate 1000 according to this embodiment includes: a substrate body 10, a first functional layer 20 and a second functional layer 30. A side of the substrate body 10 is provided with protrusions 101 and grooves 102, and the protrusions 101 alternate with the grooves 102. The first functional layer 20 is arranged on the side of the substrate body 10 where the protrusion 101 is provided. The first functional layer 20 at least partially overlaps the protrusion 101 along a direction perpendicular to a plane in which the substrate body 10 extends. The second functional layer 30 is arranged on a side of the first functional layer 20 away from the substrate body 10. The second functional layer 30 at least partially overlaps the first functional layer 20 along the direction perpendicular to the plane in which the substrate body 10 extends. The second functional layer 30 at least extends from the protrusion 101 to a sidewall 1021 of the groove 102.

The transfer substrate 1000 is applied to mass transfer of microdevices 40 (as shown in FIG. 4). In some embodiments, the microdevice 40 is a light emitting device. In the embodiments of the present disclosure, the microdevice 40 is a Micro LED or a Mini LED, but is not limited hereto. In other embodiments of the present disclosure, the microdevice 40 may be other devices (such as a micro drive chip (that is, micro IC)), which are not listed herein.

In the embodiments of the present disclosure, the substrate body 10 may be made from glass, sapphire or other hard materials. The substrate body 10 made from glass or sapphire has a smooth and stable surface as well as resistance to high temperature, facilitating the mass transfer relatively.

In the embodiments of the present disclosure, the first functional layer 20 may be made from materials whose volume changes under some conditions. In the embodiments of the present disclosure, the first functional layer 20 is made from at least one of polyimide, acrylic material, epoxy material, and silica gel. The material from which the first functional layer 20 is made is not limited herein.

In the embodiments of the present disclosure, the second functional layer 30 may be made from deformable materials such as silica gel.

FIG. 1 to FIG. 15 show embodiments where the protrusion 101 extends along a first direction F1, and the grooves 102 alternate with the protrusions 101 along only a second direction F2. Further, the grooves 102 alternate with the protrusions 101 along both the first direction F1 and the second direction F2, for example, in other embodiments as shown in FIG. 19 to FIG. 22 that are to be described in detail below. This embodiment only illustrates the positions of the first functional layer 20 and the second functional layer 30.

In the embodiments of the present disclosure, the groove 102 is provided on one side of the substrate body 10 through processes such as exposure, development and etching, which are not limited herein. The protrusion 101 is provided between grooves 102 once the grooves 102 are provided. FIG. 1 to FIG. 15 show the protrusion 101 and the groove 102 with no pattern fill. It should be understood that, the sidewall 1021 of the groove 102 serves as a sidewall of the protrusion 101.

In the embodiments of the present disclosure, the first functional layer 20 and the second functional layer 30 may be provided on the same side as the protrusion by sticking, spin coating or the like, which are not limited herein.

It should be understood that the first functional layer 20 and the protrusion 101 in the present disclosure are arranged on the same side of the substrate body 10. Further, the second functional layer 30 is also arranged on the same side of the substrate body 10 as the protrusion 101. The second functional layer 30 is located on the side of the first functional layer 20 away from the substrate body 10. The second functional layer 30 corresponding to the protrusion 101 is configured to pick up and release the microdevice 40, and therefore the second functional layer 30 is arranged on the same side of the substrate body 10 as the protrusion 101.

It should be noted that, along a direction perpendicular to the plane in which the substrate body 10 extends, the first functional layer 20 at least partially overlaps the protrusion 101. The second functional layer 30 is located on the side of the first functional layer 20 away from the substrate body 10. Along the direction perpendicular to the plane in which the substrate body 10 extends, the second functional layer 30 at least partially overlaps the first functional layer 20. The second functional layer 30 at least extends from the protrusion 101 to the sidewall 1021 of the groove 102. FIG. 1 to FIG. 15 illustrate the transfer substrate 1000 in only some embodiments, and are not intended to limit the structure of the transfer substrate 1000.

FIG. 1 and FIG. 2 illustrate the case that an orthographic projection of the first functional layer 20 on the plane in which the substrate body 10 extends is within an orthographic projection of the protrusion 101 on the plane in which the substrate body 10 extends. That is, along the direction perpendicular to the plane in which the substrate body 10 extends, the first functional layer 20 partially overlaps the protrusion 101. The orthographic projection of the first functional layer 20 on the plane in which the substrate body 10 extends is within an orthographic projection of the second functional layer 30 on the plane in which the substrate body 10 extends. The second functional layer 30 extends from the protrusion 101 to the sidewall 1021 of the groove 102. In some embodiments, the second functional layer 30 may arranged only at positions when the microdevices 40 are to be picked up and released. Reference is made to FIG. 15, which is a plan view of the transfer substrate 1000 according to another embodiment of the present disclosure. In FIG. 15, second functional layers 30 are spaced along the first direction F1. Along the direction perpendicular to the plane in which the substrate body 10 extends, the second functional layers 30 at least partially overlap the first functional layer 20. This is only one possible embodiment.

FIG. 3 and FIG. 4 illustrate the case that the orthographic projection of the first functional layer 20 on the plane in which the substrate body 10 extends is within the orthographic projection of the protrusion 101 on the plane in which the substrate body 10 extends. That is, along the direction perpendicular to the plane in which the substrate body 10 extends, the first functional layer 20 partially overlaps the protrusion 101. The orthographic projection of the first functional layer 20 on the plane in which the substrate body 10 extends is within the orthographic projection of the second functional layer 30 on the plane in which the substrate body 10 extends. The second functional layer 30 extends from the protrusion 101 to the sidewall 1021 of the groove 102 and thence to the bottom 1022 of the groove 102.

FIG. 5 and FIG. 6 illustrate the case that the first functional layer 20 overlaps the protrusion 101, and the orthographic projection of the first functional layer 20 on the plane in which the substrate body 10 extends is within the orthographic projection of the second functional layer 30 on the plane in which the substrate body 10 extends, along the direction perpendicular to the plane in which the substrate body 10 extends. The second functional layer extends from the protrusion 101 to the sidewall 1021 of the groove 102.

FIG. 7 and FIG. 8 illustrate the case that the first functional layer 20 covers the protrusion 101 along the direction perpendicular to the plane in which the substrate body 10 extends. The first functional layer 20 extends to the sidewall 1021 of the groove 102. The orthographic projection of the first functional layer 20 on the plane in which the substrate body 10 extends is within the orthographic projection of the second functional layer 30 on the plane in which the substrate body 10 extends. The second functional layer 30 extends from the protrusion 101 to the sidewall 1021 of the groove 102. The sidewall 1021 of the groove 102 is shown in FIG. 8. The second functional layer 30 completely covers the first functional layer 20, to prevent the first functional layer 20, when vaporized at the position corresponding to the protrusion 101, from evaporating from the sidewall of the protrusion (that is, the sidewall 1021 of the groove 102). Once the vaporized first functional layer 20 runs out, the second functional layer 30 on the protrusion 101 fails to protrude towards the side away from the substrate body 10, resulting in failure to release a microdevice.

Figure 10:
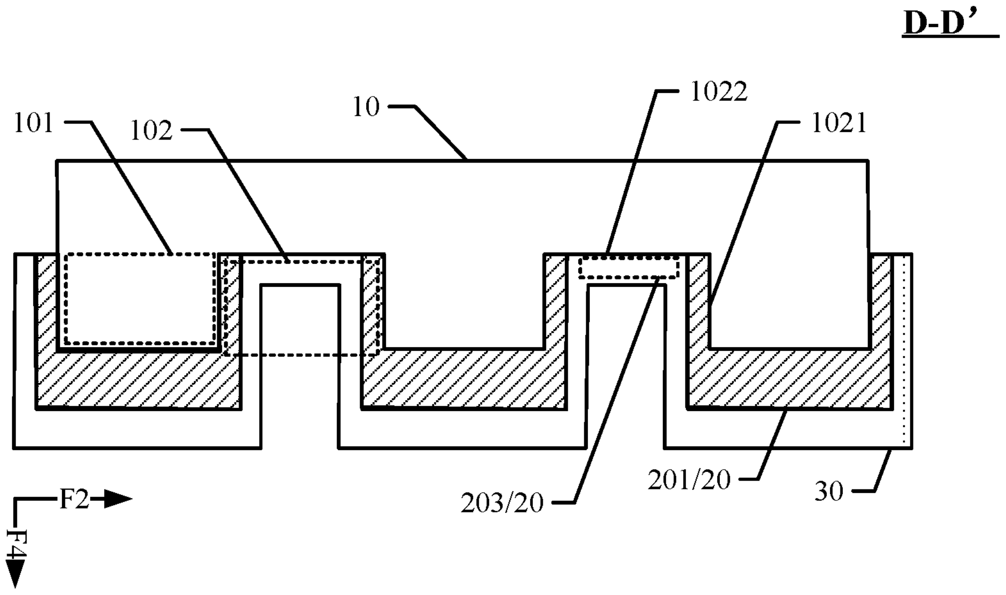
FIG. 10 is a cross-sectional view of the transfer substrate along a D-D' line in FIG. 9.

FIG. 9 and FIG. 10 illustrate the case that first functional layer 20 covers the protrusion 101 along the direction perpendicular to the plane in which the substrate body 10 extends. The first functional layer 20 extends to the sidewall 1021 of the groove 102. The orthographic projection of the first functional layer 20 on the plane in which the substrate body 10 extends is within the orthographic projection of the second functional layer 30 on the plane in which the substrate body 10 extends. The second functional layer 30 extends from the protrusion 101 to the sidewall 1021 of the groove 102 and thence to the bottom 1022 of the groove 102.

FIG. 11 and FIG. 12 illustrate the case that the first functional layer 20 covers the protrusion 101 along the direction perpendicular to the plane in which the substrate body 10 extends. The first functional layer 20 extends to the sidewall 1021 of the groove 102 and thence to the bottom 1022 of the groove 102. The orthographic projection of the first functional layer 20 on the plane in which the substrate body 10 extends partially overlaps the orthographic projection of the second functional layer 30 on the plane in which the substrate body 10 extends. The second functional layer 30 extends from the protrusion 101 to the sidewall 1021 of the groove 102. The sidewall 1021 of the groove 102 is shown in FIG. 12. The second functional layer 30 completely covers the first functional layer 20, to prevent the first functional layer 20, when vaporized at the position corresponding to the protrusion 101, from evaporating from the sidewall of the protrusion (that is, the sidewall 1021 of the groove 102). Once the vaporized first functional layer 20 runs out, the second functional layer 30 on the protrusion 101 fails to protrude towards the side away from the substrate body 10, resulting in failure to release a microdevice.

FIG. 13 and FIG. 14 illustrate the case that the first functional layer 20 covers the protrusion 101 along the direction perpendicular to the plane in which the substrate body 10 extends. The first functional layer 20 extends to the sidewall 1021 of the groove 102 and thence to the bottom 1022 of the groove 102. The orthographic projection of the first functional layer 20 on the plane in which the substrate body 10 extends covers the orthographic projection of the second functional layer 30 on the plane in which the substrate body 10 extends. The second functional layer 30 extends from the protrusion 101 to the sidewall 1021 of the groove 102 and thence to the bottom 1022 of the groove 102.

Figure 16:
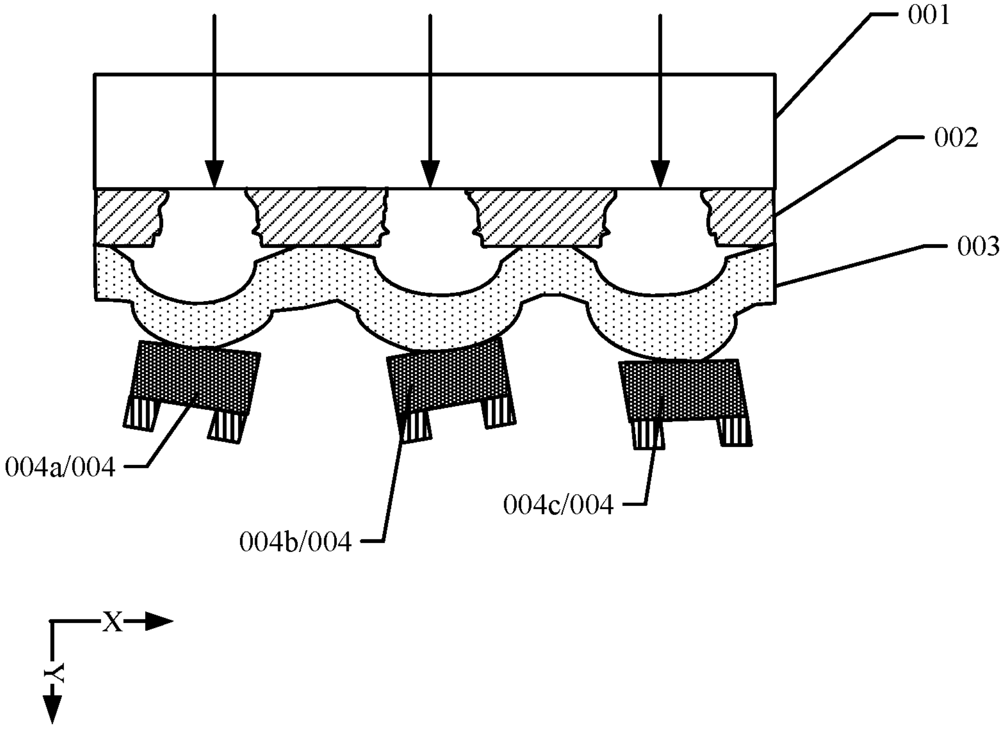
FIG. 16 is a plan view of a transfer substrate according to the related technology.

It is found that there is displacement in the transfer process in the related art. Reference is made to FIG. 16, which is a schematic structural diagram illustrating a transfer substrate in the related art. FIG. 16 shows a state of the second functional layer 003 during the transfer process in the related art. The transfer substrate in FIG. 16 includes a substrate body 001, a first functional layer 002 located on one side of the substrate body 001, and a second functional layer 003 located on one side of the first functional layer 002. On the side of the second functional layer 003 away from the substrate body 001 are microdevices 004. FIG. 16 shows only a microdevice 004*a*, a microdevice 004*b* and a microdevice 004*c* for illustration. The volume of the first functional layer 002 corresponding to the microdevice 004*b* is increased by means of light and heat in order to release the microdevice 004*b*. FIG. 16 shows an example that the volume of the first functional layer 002 increases due to expansion resulted from gasification of the first functional layer 002 corresponding to the microdevice 004 *b*. The second functional layer 003 deforms, that is, protrudes towards the side away from the substrate, as the first functional layer 002 increases in volume due to gasification, to release the microdevice 004*b*. The second functional layers 003 corresponding to the microdevice 004*a* and the microdevice 004*c* are prone to deformation as the second functional layer 003 corresponding to the microdevice 004*b* is deforms, and thus the microdevice 004*a* and the microdevice 004*c* are displaced in a direction Y. A second functional layer 003 closer to the microdevice 004*b* is subjected to the greater pull, and therefore a microdevice corresponding to this second functional layer 003 is prone to larger displacement in the direction Y. In this regard, the microdevice 004*a* and the microdevice 004*c* are prone to tilt. Due to tilt along both the direction Y and the direction X, the microdevice 004*a* and the microdevice 004*c*, when being released, fail to fall on their respective right positions. Instead, the microdevice 004*a* and the microdevice 004*c* each have displacement from their respective target positions in the direction X. In order to transfer the microdevice 004*a*, the microdevice 004*b* and the microdevice 004*c* the same time, the first functional layers 002 corresponding to the microdevice 004*a*, the microdevice 004*b* and the microdevice 004*c* increase in volume. Then, respective second functional layer 003 deform due to expansion resulted from gasification of the first functional layers 002, protruding towards the side away from the substrate body, to release the microdevice 004*a*, the microdevice 004*b* and the microdevice 004*c*. However, one of the second functional layers 002 corresponding to the microdevices 004*a*, 004*b* and 004*c* is prone to deformation of another, and thus the microdevices 004*a*, 004*b* and 004*c* are displaced in the direction Y. A second functional layer 003 closer to the microdevice is subjected to the greater pull, and therefore a microdevice corresponding to this second functional layer 003 is prone to larger displacement in the direction Y. In this regard, the microdevices 004*a*, 004*b* and 004*c* are prone to tilt. Due to tilt along both the direction Y and the direction X, all the microdevices

004*a*, 004*b* and 004*c* fail to fall on their respective right positions. Instead, the microdevices 004*a*, 004*b* and 004*c* each have displacement from their respective target positions in the direction X.

Reference is made to FIG. 17, which is a cross-sectional view of the transfer substrate along a K-K' line in FIG. 3 according to another embodiment. FIG. 17 shows the state during the transfer process. It should be noted that the microdevice 40 is shown in FIG. 4 and FIG. 17 in order to illustrate the transfer process. FIG. 17 shows only the transfer substrate in FIG. 3 for illustration. The transfer substrate shown in FIG. 1, FIG. 2, and FIG. 5 to FIG. 15 may have the same effect, and thus is not described in detail herein.

In the present disclosure, the grooves 102 alternate with the protrusions 101 of the substrate body 10, and the second functional layer 30 extends from the protrusion 101 to at least the sidewall 1021 of the groove 102. As shown in FIG. 17, the second functional layer 30 extends to the bottom 1022 of the groove 102. For example, in order to release the microdevice 40*a* on the protrusion 101*a*, the first functional layer 20*a* corresponding to the protrusion 101*a* is subjected to light, heat or the like and then increases in volume, resulting in deformation of the second functional layer 30*a* corresponding to the protrusion 101*a*. That is, the second functional layer 30*a* protrudes towards the side away from the protrusion 101*a*. As the second functional layer 30*a* corresponding to the protrusion 101*a* deforms, a second functional layer 30 corresponding to a protrusion adjacent to the protrusion 101*a* is pulled in a fourth direction, and thus has displacement in the fourth direction F4. If there is no groove 102 between protrusions 101 and the second functional layer 30 fails to extend to the sidewall 1021 of the groove 102, then the displacement of the second functional layer 30 in the fourth direction is S1. In the present disclosure, the groove 102 is provided between protrusions 101 and the second functional layer 30 extends to the sidewall 1021 of the groove 102 instead. Therefore, frictional force between the second functional layer 30 and the sidewall 1021 of the groove 102 reduces the displacement of the second functional layer 30 caused by the pull. The displacement of the second functional layer 30 in the fourth direction in this case is S2, which is smaller than S1. Therefore, the deformation of the second functional layer 30*a* corresponding to the protrusion 101*a* has little influence on the second functional layers 30 corresponding to the protrusion 101*b* and the protrusion 101*c*. That is, the second functional layers 30 corresponding to the protrusion 101*b* and the protrusion 101*c* are not provided due to the pull, to avoid the displacement of the microdevices 40*b* and 40*c* when being released.

In the embodiments of the present disclosure, as shown in FIG. 1, FIG. 2, FIG. 5 to FIG. 8, FIG. 11, FIG. 12 and FIG. 15, the second functional layers 30 are spaced in the second direction F2. Therefore, in the second direction F2, the deformation of the second functional layer 30 corresponding to one protrusion 101 due to the increase in volume of its first functional layer 20 fails to affect the second functional layer 30 corresponding to a neighboring protrusion 101.

Compared with the stamp-based mass transfer in the conventional technology, microdevices 40 can be transferred selectively according to the present disclosure. The second functional layer 30 corresponding to the protrusion 101 picks up a microdevice 40 which is to be attached to the second functional layer 30, and then deforms or its viscosity is reduced when the first functional layer 20 corresponding to the protrusion 101 is subjected to light, heat or the like, to release the microdevice 40. The first functional layer 20 corresponding to which protrusion 101 is subjected to light, heat or the like depends on a target microdevice 40 to be released, and the microdevices 40 can be transferred selectively.

Figure 18:
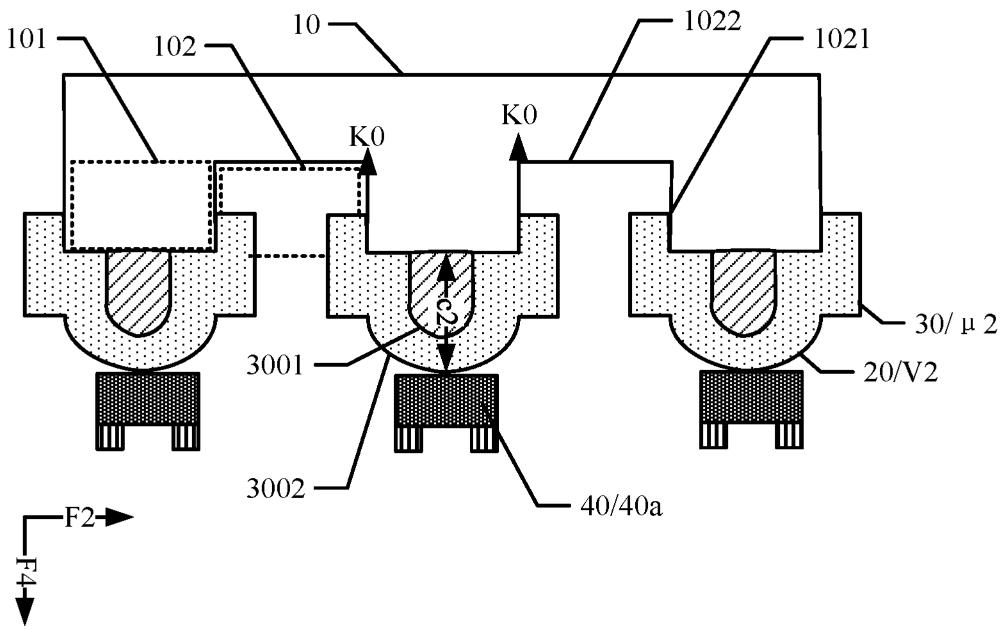
FIG. 18 is a cross-sectional view of the transfer substrate along the A-A' line in FIG. 1 according to another embodiment.

FIG. 1, FIG. 2, and FIG. 18 illustrate some embodiments. FIG. 18 is a cross-sectional view of the transfer substrate along the A-A' line in FIG. 1 according to another embodiment. FIG. 2 illustrates an example in which the first functional layer 20 is in a first state. FIG. 18 illustrates an example in which the first functional layer 20 is in a second state. In this embodiment, the first functional layer 20 switches between a first state and a second state. The volume of the first functional layer 20 is V1 in the first state and is V2 in the second state, and V2 is greater than V1. In the second state, the second functional layer 30 protrudes toward the side away from the protrusion 101.

The first functional layer 20 is in the first state in FIG. 2 and in the second state in FIG. 18. The microdevice 40 is shown in FIG. 18. The first functional layer 20 in FIG. 18 is larger than the first functional layer 20 in FIG. 2 in volume. In the embodiments of the present disclosure, the first functional layer 20 may be made of heat-expandable materials or gasifiable materials. The first functional layer 20 corresponding to the protrusion 101 is subjected to light, heat or the like, and then switches from the first state to the second state. The volume of the first functional layer 20 is increased from V1 to V2 accordingly. Due to the increase in volume of the first functional layer 20, the second functional layer 30 deforms, protruding towards the side away from the protrusion 101. The microdevice 40 is in less contact with the second functional layer 30 due to the deformation of the second functional layer 30, and therefore to be released. FIG. 18 shows a state in which the microdevice 40 is about to be released.

In this embodiment, the first functional layer 20 switches between the first state and the second state. The volume of the first functional layer 20 is V1 in the first state and is V2 in the second state, and V2 is greater than V1. In the second state, the second functional layer 30 deforms, protruding toward the side away from the protrusion 101. The microdevice 40 is in less contact with the second functional layer 30 due to the deformation of the second functional layer 30, and therefore to be released.

In some embodiments, the first functional layer 20 may be made of heat-expandable materials or gasifiable materials. The second functional layer 30 extends to the sidewall 1021 of the groove 102, to prevent the target microdevice 40 from being displaced when released. In order to release the target microdevice 004*b* shown in FIG. 16, the first functional layer 002 is subjected to light, heat or the like, and therefore vaporizes or expands. FIG. 16 shows only an example in which the first functional layer 002 vaporizes. Due to randomness of gas expansion, the second functional layer 003 fails to protrude right towards a center of the microdevice 004*b* as the first functional layer 002 vaporizes. When the second functional layer 003 protrudes away from the center of the microdevice 004*b*, the microdevice 004*b* tilts in a direction X and a direction Y before its release and therefore is to fall at a position with a displacement from its target position.

In this embodiment, the second functional layer 30 extends from the protrusion 101 to at least the sidewall 1021 of the groove 102. In FIG. 18, the release of the microdevice 40*a* is taken as an example for illustration. The volume of the first functional layer 20 increases to V2 in the second state. The first functional lay r 20 increases randomly in volume, and then expands in a random direction. Therefore, the force exerted by the expansion of the first functional layer 20 on the second functional layer 30 is also in a random direction. The second functional layer 30 extends to the sidewall 1021 of the groove 102, and therefore is subjected to friction in a direction K0. Therefore, deformation of the second functional layer 30 at an edge of the protrusion 101 is restricted. Due to the friction, the deformation of the second functional layer 30 near the edge of the protrusion 101 is lighter than that of the second functional layer 30 facing the center of the protrusion 101. That is, the deformation of the second functional layer 30 facing the center of the protrusion 101, i.e., the center of the microdevice 40, is larger, and the microdevice 40 may fall at its target position after release, to solve the problem that the microdevice 40 is displaced due to the fact that the second functional layer 30 fails to protrude right towards the center of the microdevice 40.

In some embodiments, the viscosity of the second functional layer 30 in the first state is $\mu 1$ and in the second state is $\mu 2$, and $\mu 1$ is greater than $\mu 2$, as shown in FIG. 2 and FIG. 18.

The first functional layer 20 corresponding to the protrusion 101 is subjected to light, heat or the like, and then switches from the first state to the second state. The volume of the first functional layer 20 is increased from V1 to V2 accordingly. Due to the increase in volume of the first functional layer 20, the second functional layer 30 deforms, protruding towards the side away from the protrusion 101. Further, the viscosity of the second functional layer 30 also decreases from $\mu 1$ of the first state to $\mu 2$, facilitating detachment of the microdevice 40 from the second functional layer 30.

In some embodiments, referring to FIGS. 1 to 15, the protrusion 101 extends along the first direction F1, and alternates with the groove 102 along the second direction F2. Both the first direction F1 and the second direction F2 are parallel to the plane in which the substrate body 10 extends, and the first direction F1 intersects the second direction F2.

In FIGS. 1 to 15, protrusions 101 extend along the first direction F1 and are spaced along the second direction F2, and alternate with the grooves 102 along the second direction F2. In the embodiments of the present disclosure, the orthographic projection of the protrusion 101 on the plane in which the substrate body 10 extends is in the shape of a strip. Similarly, the orthographic projection of the groove 102 on the plane in which the substrate body 10 extends is in the shape of a strip.

In addition to the beneficial effects mentioned above, the transfer substrate 1000 is this embodiment has the protrusion 101 and the groove 102 extending only along the first direction F1, which is beneficial for formation of the groove 102.

Figure 19:
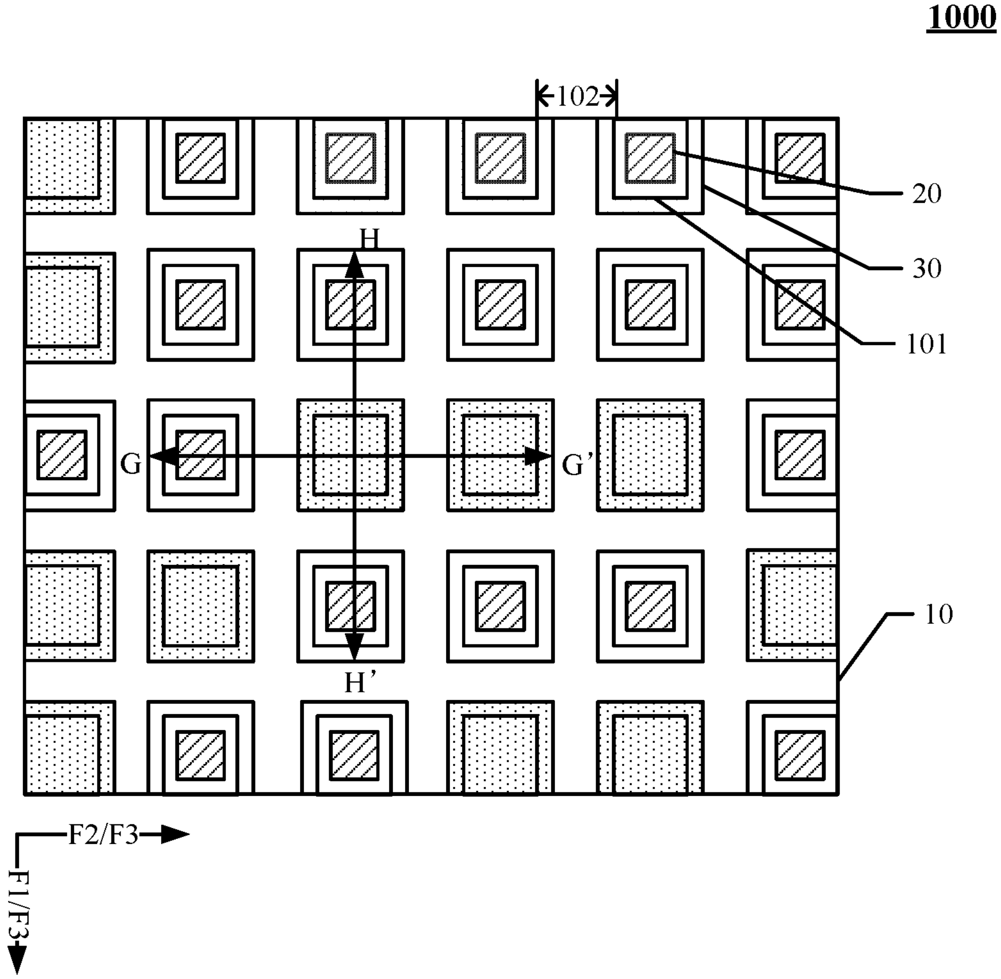
FIG. 19 is a plan view of the transfer substrate according to another embodiment of the present disclosure.
Figure 20:
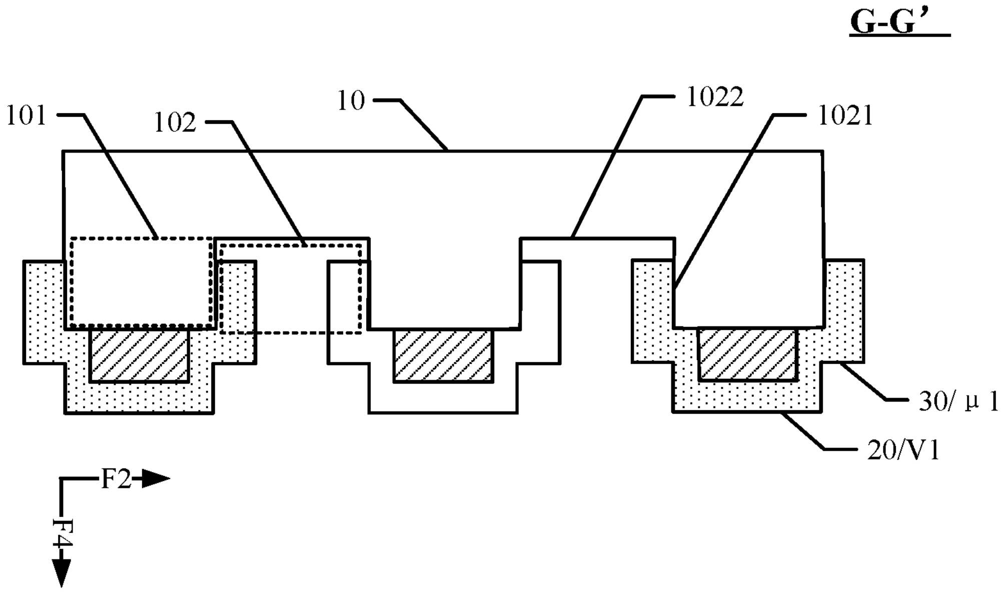
FIG. 20 is a cross-sectional view of the transfer substrate along a G-G' line in FIG. 19.
Figure 21:
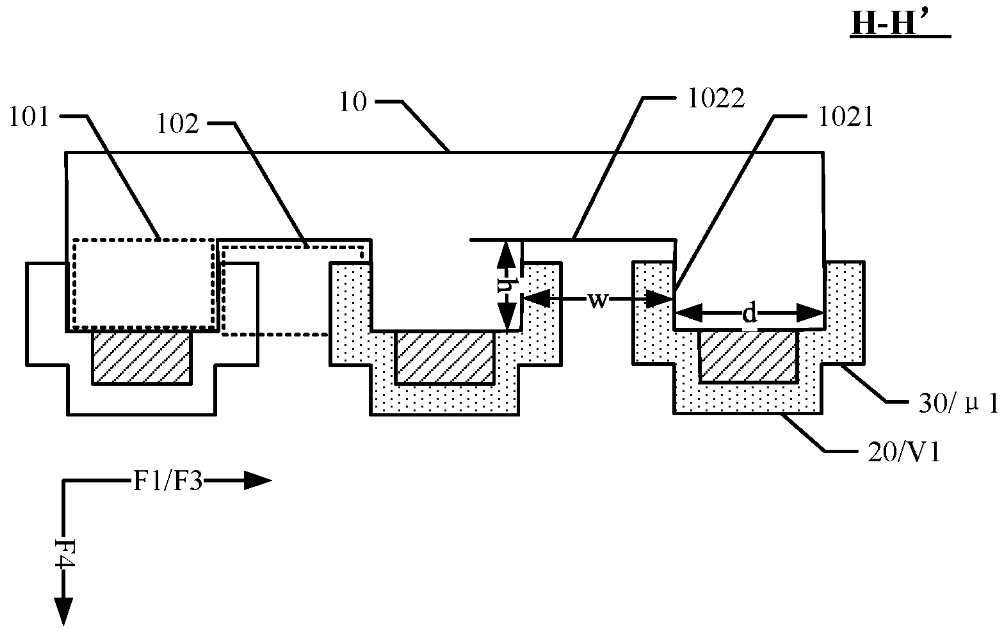
FIG. 21 is a cross-sectional view of the transfer substrate along an H-H' line in FIG. 19.

FIGS. 19 to 22 illustrate some embodiments. FIG. 19 is a plan view of the transfer substrate according to another embodiment of the present disclosure. FIG. 20 is a cross-sectional view of the transfer substrate along a G-G' line in FIG. 19. FIG. 21 is a cross-sectional view of the transfer substrate along an H-H' line in FIG. 19. The grooves 102 alternate with the protrusions 101 along both the first direction F1 and the second direction F2. Both the first direction F1 and the second direction F2 are parallel to the plane in which the substrate body 10 extends, and the first direction F1 intersects the second direction F2.

In this embodiment, there are grooves 102 alternating with the protrusions 101 along the first direction F1 and the second direction F2. This embodiment only illustrates the case that the orthographic projection of the first functional layer 20 on the plane in which the substrate body 10 extends is within the orthographic projection of the protrusion 101 on the plane in which the substrate body 10 extends. That is, along the direction perpendicular to the plane in which the substrate body 10 extends, the first functional layer 20 partially overlaps the protrusion 101, and the orthographic projection of the first functional layer 20 on the plane in which the substrate body 10 extends is within the orthographic projection of the second functional layer 30 on the plane in which the substrate body 10 extends. The second functional layer 30 extends from the protrusion 101 to the sidewall 1021 of the groove 102. The second functional layers 30 are spaced in both the first direction F1 and the second direction F2.

Figure 22:
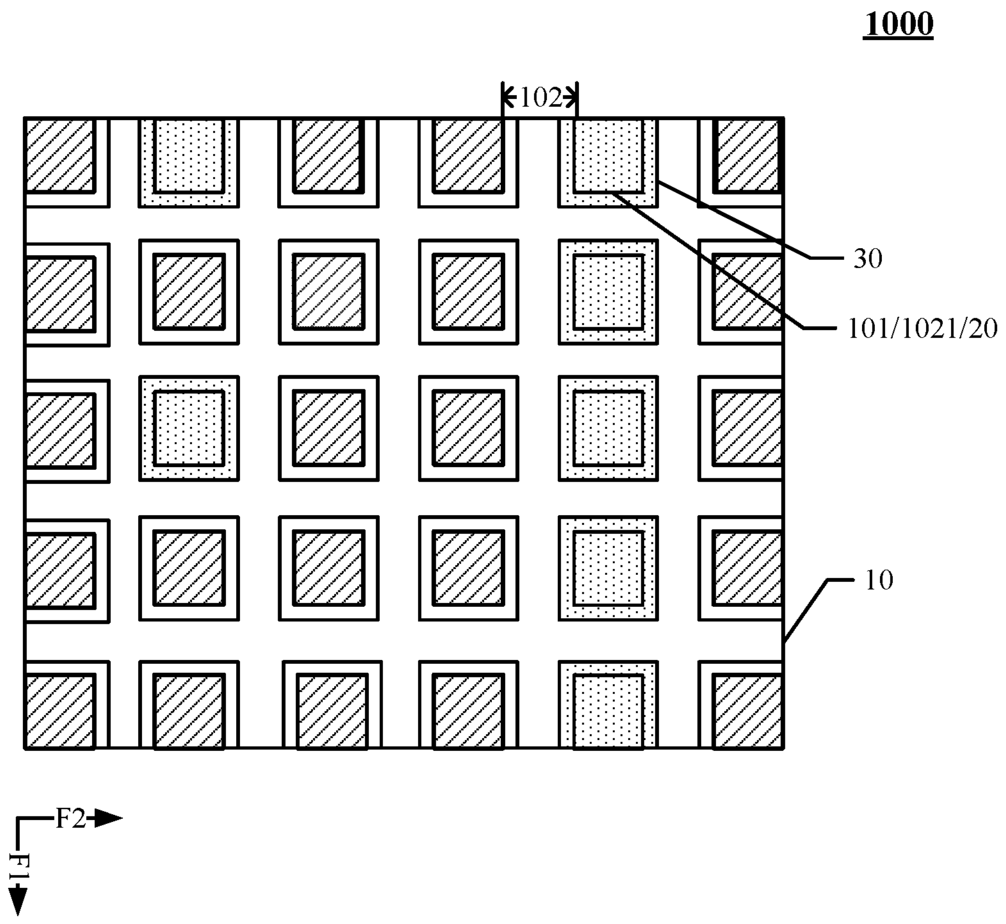
FIG. 22 is a plan view of the transfer substrate according to another embodiment of the present disclosure.
Figure 23:
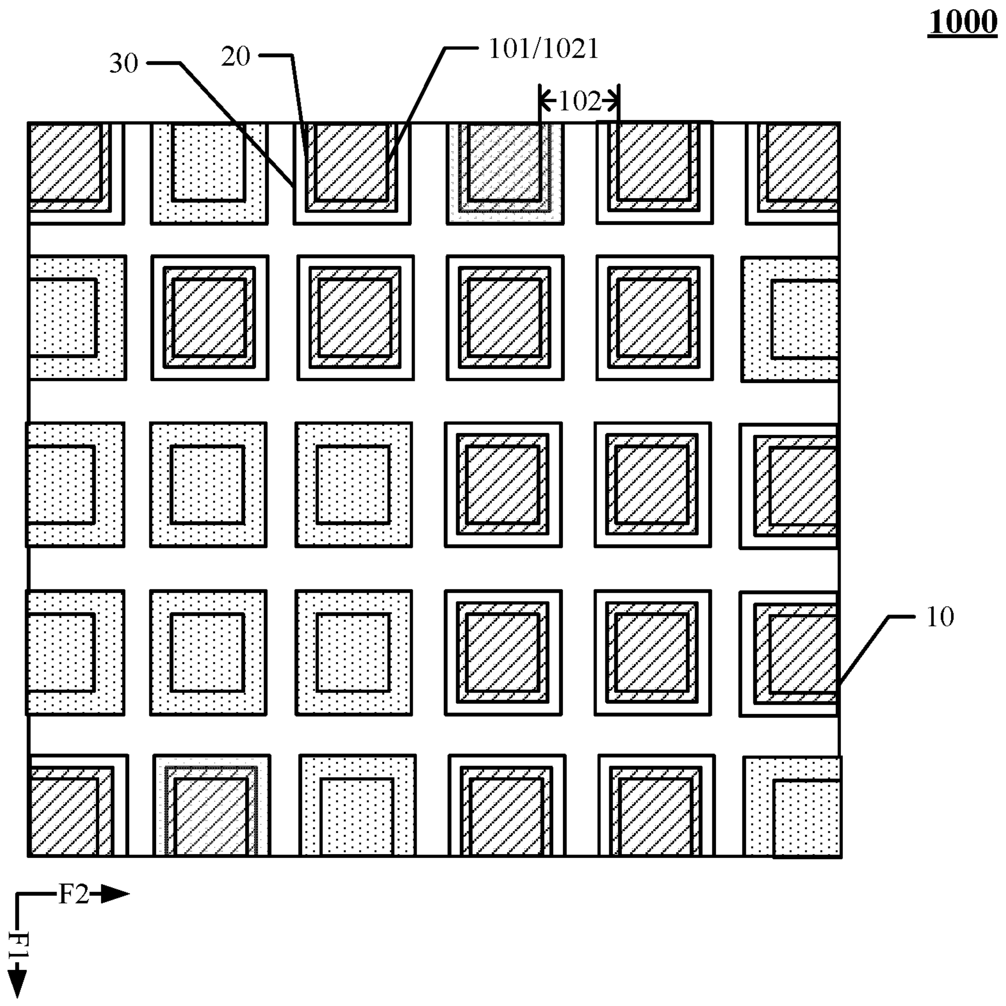
FIG. 23 is a plan view of the transfer substrate according to another embodiment of the present disclosure.
Figure 24:
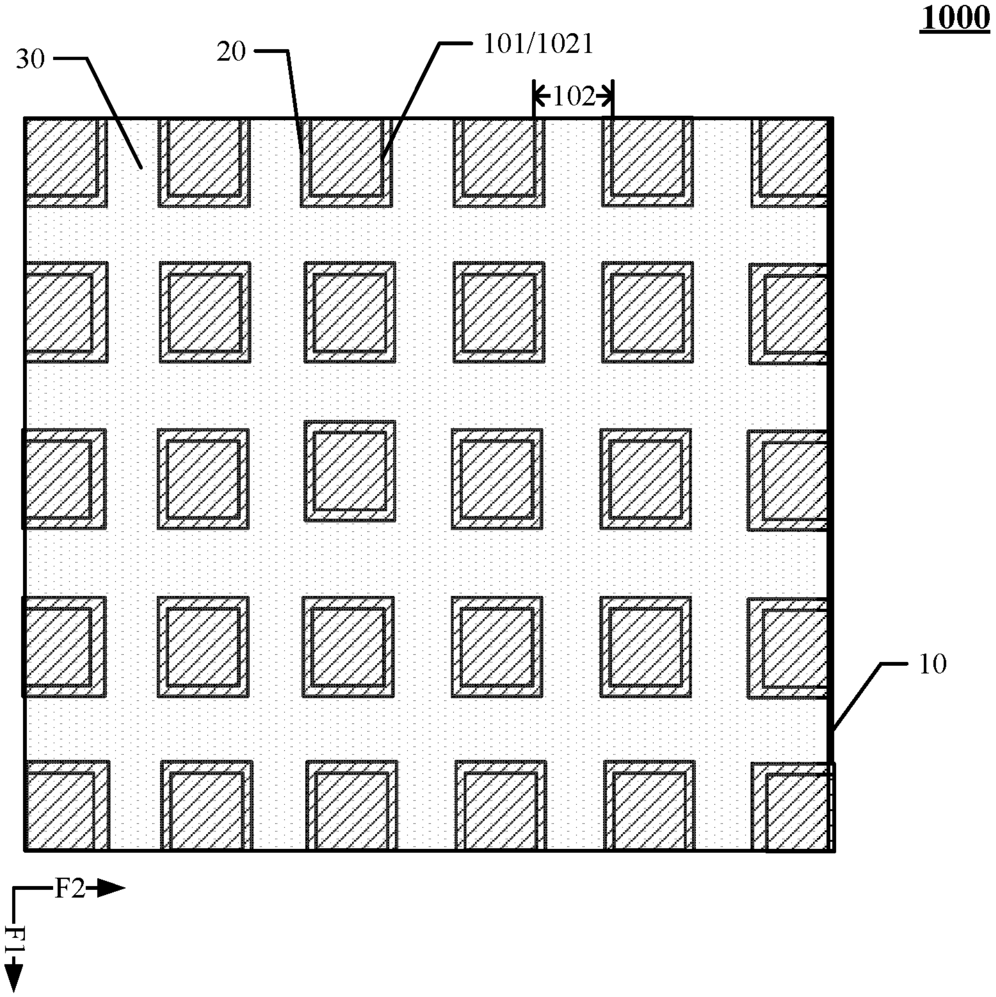
FIG. 24 is a plan view of the transfer substrate according to another embodiment of the present disclosure.
Figure 25:
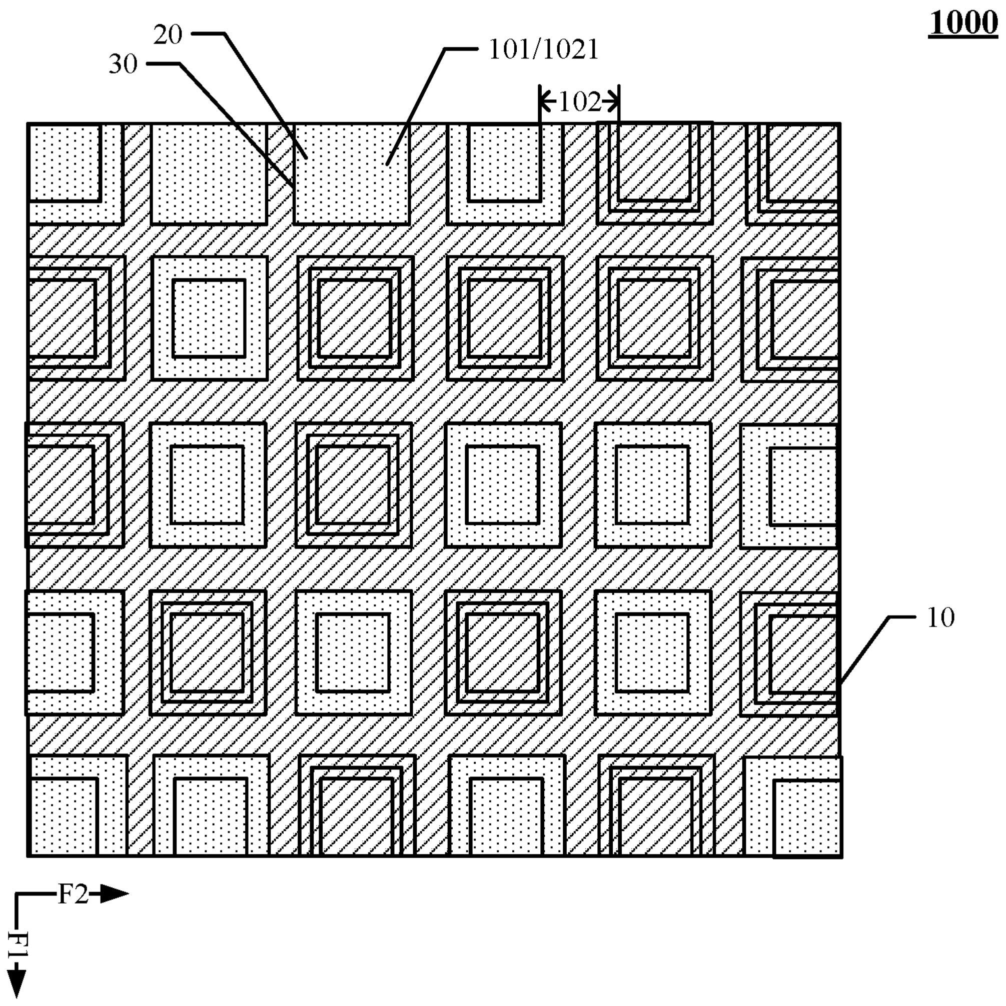
FIG. 25 is a plan view of the transfer substrate according to another embodiment of the present disclosure.
Figure 26:
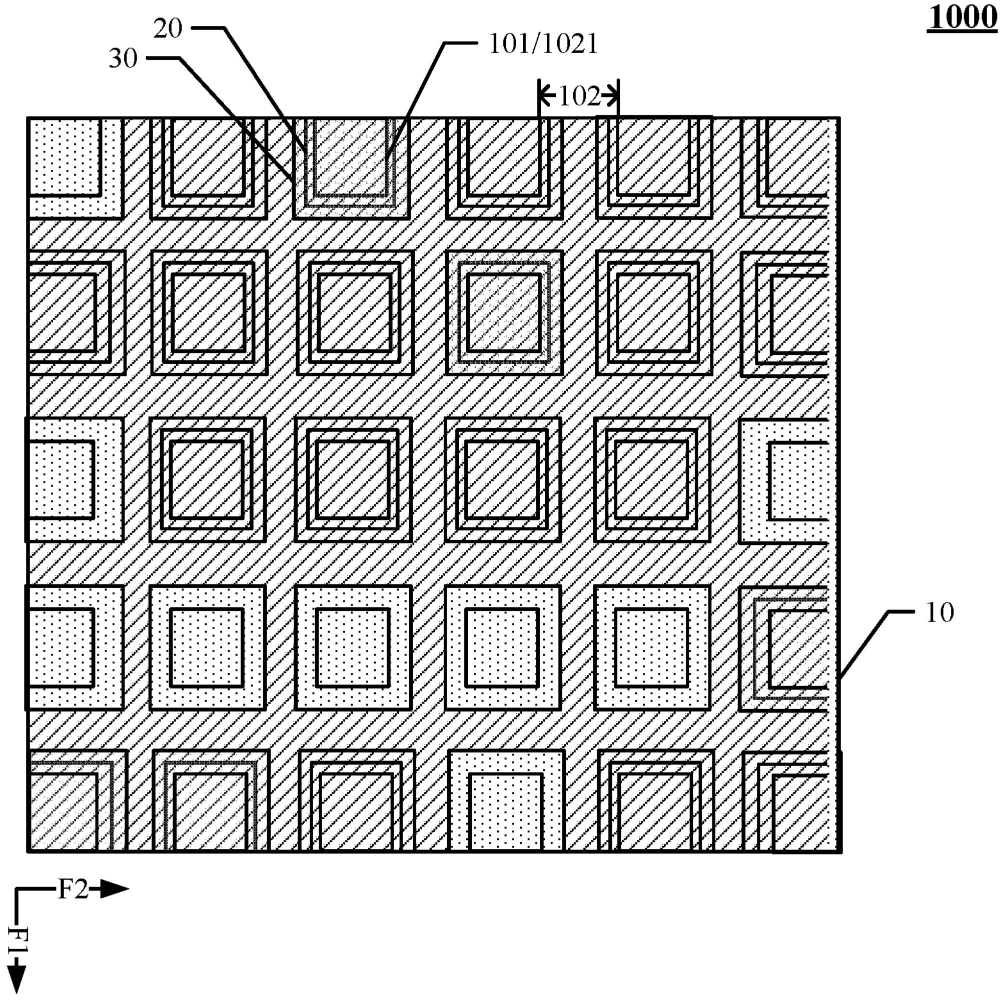
FIG. 26 is a plan view of the transfer substrate according to another embodiment of the present disclosure.

Reference is further made to FIGS. 22 to 26 for the details about the first functional layer 20 and the second functional layer 30. FIG. 22 is a plan view of the transfer substrate according to another embodiment of the present disclosure. FIG. 23 is a plan view of the transfer substrate according to another embodiment of the present disclosure. FIG. 24 is a plan view of the transfer substrate according to another embodiment of the present disclosure. FIG. is a plan view of the transfer substrate according to another embodiment of the present disclosure. FIG. 26 is a plan view of the transfer substrate according to another embodiment of the present disclosure. In FIGS. 22 to 26, there are grooves 102 alternating with the protrusions 101 along both the first direction F1 and the second direction F2. In FIG. 22, along the direction perpendicular to the plane in which the substrate body 10 extends, the first functional layer 20 covers the protrusion 101, and the orthographic projection of the first functional layer 20 on the plane in which the substrate body 10 extends is within the orthographic projection of the second functional layer 30 on the plane in which the substrate body 10 extends. The second functional layer 30 extends from the protrusion 101 to the sidewall 1021 of the groove 102. FIG. 6 shows a cross-section of the transfer substrate shown in FIG. 22. In FIG. 23, the first functional layer 20 covers the protrusion 101 along the direction perpendicular to the plane in which the substrate body 10 extends. The first functional layer 20 extends to the sidewall 1021 of the groove 102. The orthographic projection of the first functional layer 20 on the plane in which the substrate body 10 extends is within the orthographic projection of the second functional layer 30 on the plane in which the substrate body 10 extends. The second functional layer 30 extends from the protrusion 101 to the sidewall 1021 of the groove 102. FIG. 8 shows a cross-section of the transfer substrate shown in FIG. 23. In FIG. 24, the first functional layer 20 covers the protrusion 101 along the direction perpendicular to the plane in which the substrate body 10 extends. The first functional layer 20 extends to the sidewall 1021 of the groove 102. The orthographic projection of the first functional layer 20 on the plane in which the substrate body 10 extends is within the orthographic projection of the second functional layer 30 on the plane in which the substrate body 10 extends. The second functional layer 30 extends from the protrusion 101 to the sidewall 1021 of the groove 102 and thence to the bottom 1022 of the groove 102. FIG. shows a cross-section of the transfer substrate shown in FIG. 24. In FIG. 25, the first functional layer 20 covers the protrusion 101 along the direction perpendicular to the plane in which the substrate body 10 extends. The first functional layer 20 extends to the sidewall 1021 of the groove 102 and thence to the bottom 1022 of the groove 102. The orthographic projection of the first functional layer 20 on the plane in which the substrate body 10 extends is within the orthographic projection of the second functional layer 30 on the plane in which the substrate body 10 extends. The second functional layer 30 extends from the protrusion 101 to the sidewall 1021 of the groove 102. FIG. 12 shows a cross-section of the transfer substrate shown in FIG. 25. In FIG. 26, the first functional layer 20 covers the protrusion 101 along the direction perpendicular to the plane in which the substrate body 10 extends. The first functional layer 20 extends to the sidewall 1021 of the groove 102 and thence to the bottom 1022 of the groove 102. The orthographic projection of the first functional layer 20 on the plane in which the substrate body 10 extends covers the orthographic projection of the second functional layer 30 on the plane in which the substrate body 10 extends. The second functional layer 30 extends from the protrusion 101 to the sidewall 1021 of the groove 102 and thence to the bottom 1022 of the groove 102. FIG. 14 shows a cross-section of the transfer substrate shown in FIG. 26.

It should be understood that, according to the embodiments shown in FIG. 19 to FIG. 26, deformation of a second functional layer 30 corresponding to a neighboring protrusion 101 resulted from the pull can be successfully avoided in the second direction F2, to prevent a microdevice 40 on the neighboring protrusion 101 from being displaced in the second direction F2 during release. In addition, deformation of the second functional layer 30 corresponding to the same protrusion 101 resulted from the pull can be successfully avoided in the first direction F1, to prevent the microdevice 40 on the protrusion 101 from being displaced in the first direction F1 during release. That is, deformation of a second functional layer 30 corresponding to a protrusion 101 resulted from the pull can be successfully avoided in both the first direction F1 and the second direction F2, and therefore a microdevice 40 on the protrusion 101 can be successfully prevented from being displaced in both the first direction F1 and the second direction F2 during release.

Figure 27:
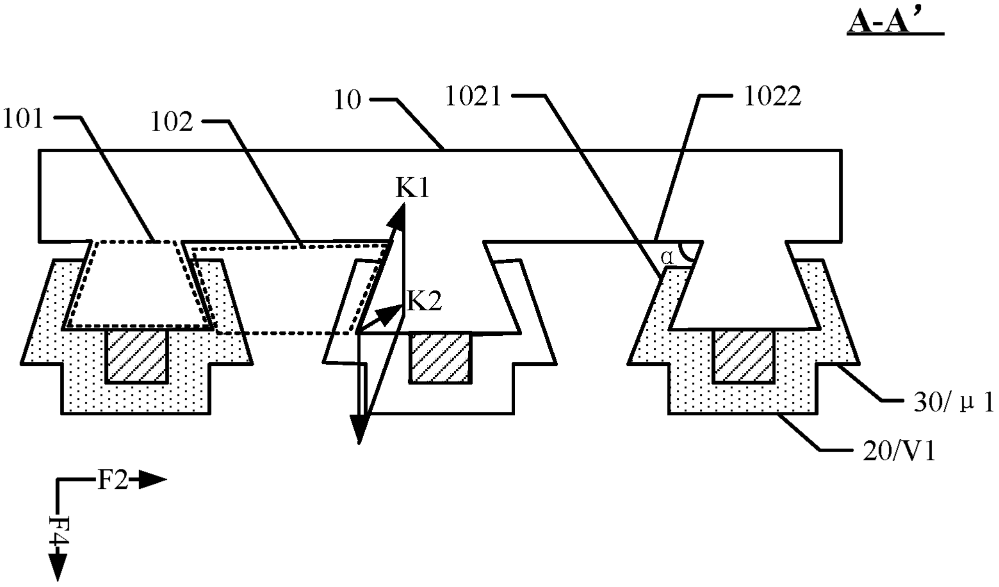
FIG. 27 is a cross-sectional view of the transfer substrate along the A-A' line in FIG. 1 according to another embodiment.

FIGS. 2, 6, 8, 10, 12, 14 and 27 show some embodiments. FIG. 27 is a cross-sectional view of the transfer substrate along the A-A' line in FIG. 1. An included angle between the sidewall 1021 of the groove 102 and the bottom 1022 of the groove 102 is less than or equal to 90°.

In FIGS. 2, 6, 8, 10, 12, and 14, the included angle between the sidewall 1021 of the groove 102 and the bottom 1022 of the groove 102 is equal to 90°. In FIG. 27, the included angle between the sidewall 1021 of the groove 102 and the bottom 1022 of the groove 102 is less than 90°.

It should be understood that the groove may be rectangular, trapezoidal or the like in cross-section, which is not limited herein. As long as the second functional layer 30 extends from the protrusion 101 to the sidewall 1021 of the groove 102, the deformation of the second functional layer 30 corresponding to the neighboring protrusion 101 resulted from the pull can be prevented, to prevent a microdevice 40 on the protrusion 101 from being displaced during release.

In the embodiments of the present disclosure, in the case that the included angle between the sidewall 1021 of the groove 102 and the bottom 1022 of the groove 102 is less than 90°, the sidewall 1021 of the groove 102 is inclined towards the inside of the protrusion 101. In the second state, the second functional layer 30 corresponding to the protrusion 101 deforms and is subjected to a pull in the fourth direction F4. Since the second functional layer extends to the sidewall 1021 of the groove 102 and the sidewall 1021 of the groove 102 is inclined towards the inside of the protrusion 101, the second functional layer 30 is less likely to be displaced, to prevent a second functional layer 30 corresponding to a neighboring protrusion 101 from deforming due to the pull. In addition, the friction exerted by the sidewall 1021 of the groove 102 on the second functional layer 30 is along the sidewall 1021 of the groove 102, as indicated by a direction K1 in FIG. 27, which intersects the fourth direction F4. The pull and the friction form a resultant force in the direction of K2. It can be seen that the resultant force acts towards the inside of the protrusion 101, which further reducing the displacement of the second functional layer 30 corresponding to the protrusion 101 in the fourth direction. In the fourth direction, the deformation of the second functional layer 30 near the edge of the protrusion 101 is lighter than that of the second functional layer 30 facing the center of the protrusion 101. That is, the deformation of the second functional layer 30 facing the center of the microdevice 40 is larger, and the microdevice 40 may fall at its target position after release, to solve the problem that the microdevice 40 is displaced due to the fact that the second functional layer 30 fails to protrude right towards the center of the microdevice 40.

Figure 28:
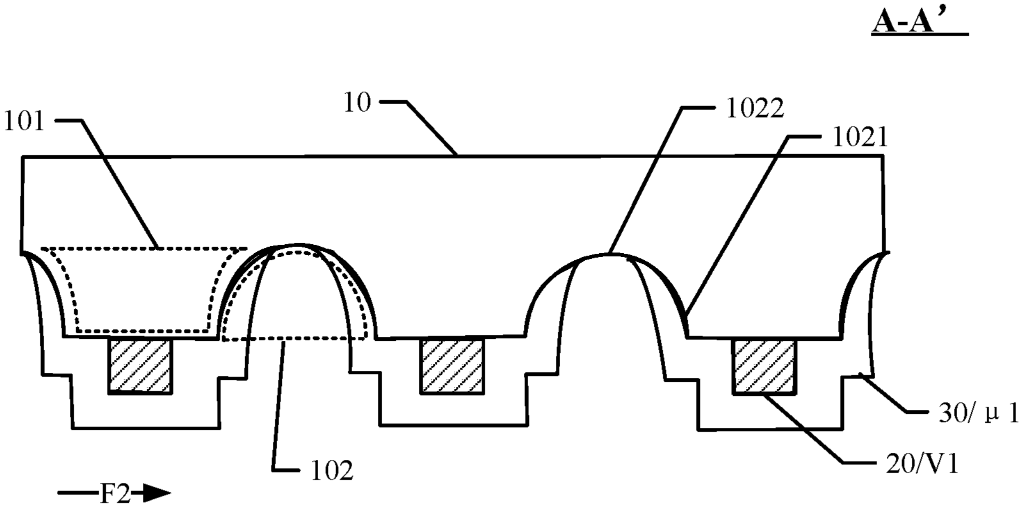
FIG. 28 is a cross-sectional view of the transfer substrate along the A-A' line in FIG. 1 according to another embodiment.

Reference is made to FIG. 28, which is a cross-sectional view of the transfer substrate along the A-A' line in FIG. 1 according to another embodiment. In this embodiment, at least one of the sidewall 1021 and the bottom 1022 of the groove 102 is arc-shaped in cross section.

FIG. 28 schematically illustrates a case that both the sidewall 1021 and the bottom 1022 of the groove 102 are arc-shaped in cross section. In the embodiments of the present disclosure, the sidewall 1021 of the groove 102 has a plane surface, and the bottom 1022 of the groove 102 has an arc surface. Alternatively, the sidewall 1021 of the groove 102 has an arc surface, and the bottom 1022 of the groove 102 has a plane surface.

The groove 102 in this embodiment also has the above-mentioned beneficial effects, which are not repeated here. In addition, in this embodiment, at least one of the sidewall 1021 and the bottom 1022 of the groove 102 has an arc surface. Therefore, the groove 102 can be formed by processes such as exposure, development, and etching. The arc surface is easier to be formed, to simplify the process of forming the groove 102.

Figure 29:
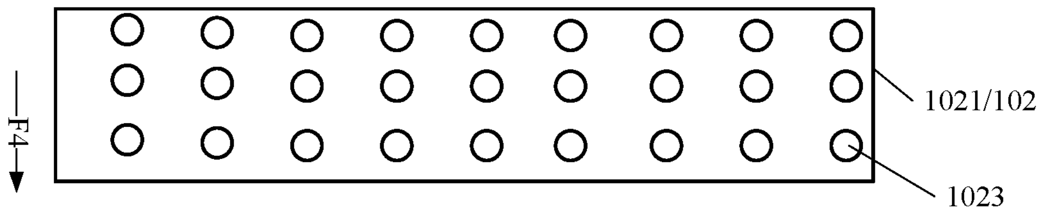
FIG. 29 is a plan view of a sidewall of a groove according to an embodiment of the present disclosure.
Figure 30:
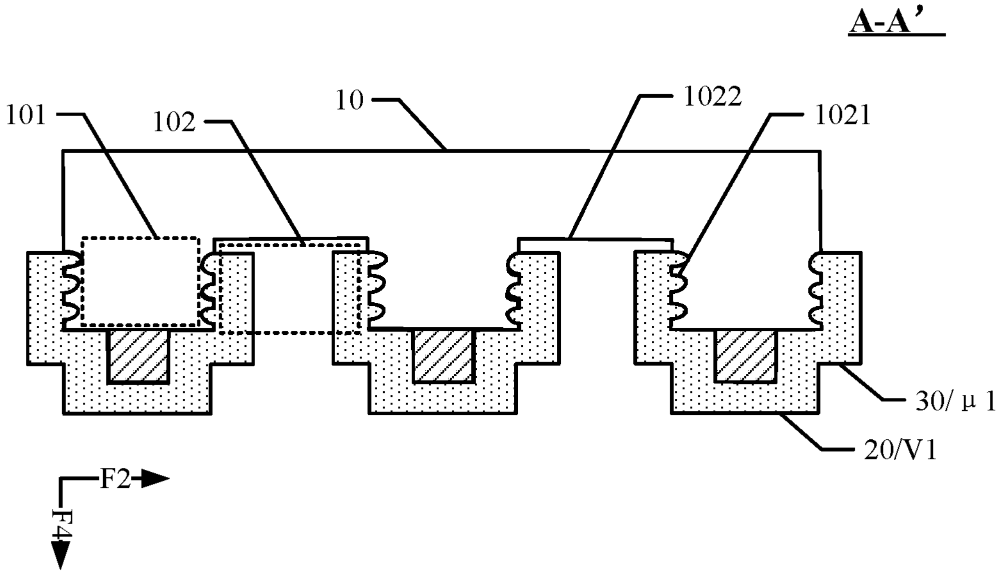
FIG. 30 is a cross-sectional view of the transfer substrate along the A-A' line in FIG. 1 according to another embodiment.
Figure 31:
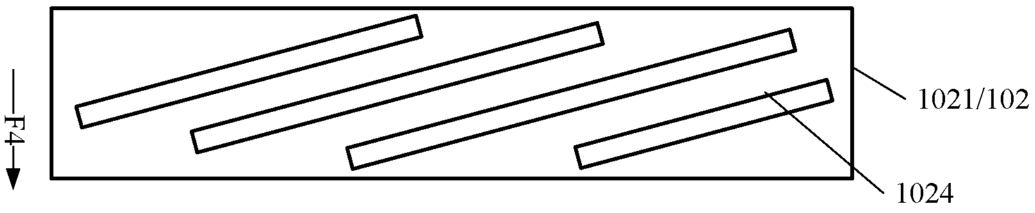
FIG. 31 is a plan view of the sidewall of the groove according to another embodiment of the present disclosure.
Figure 32:
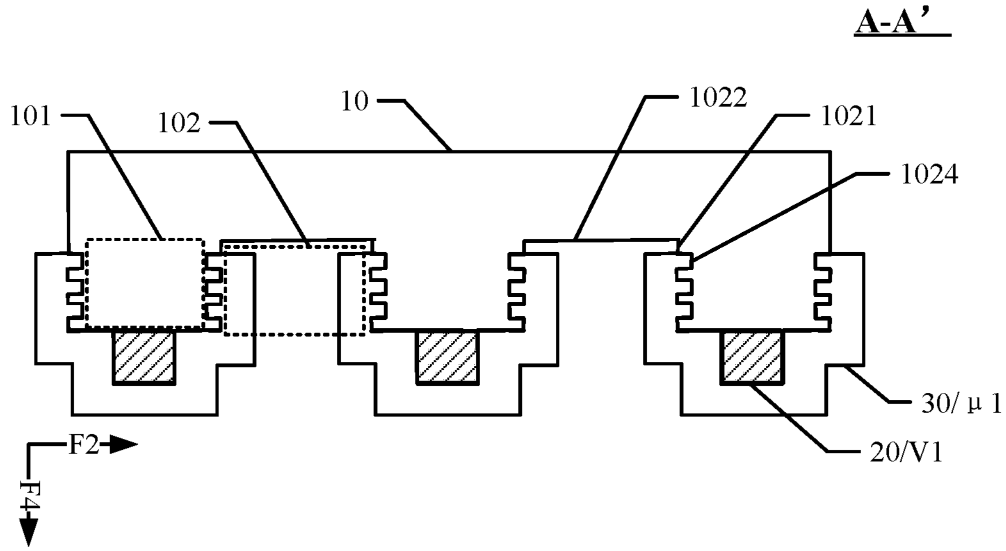
FIG. 32 is a cross-sectional view of the transfer substrate along the A-A' line in FIG. 1 according to another embodiment.

FIGS. 29 to 32 show some embodiments. FIG. 29 is a plan view of a sidewall of a groove according to an embodiment of the present disclosure. FIG. 30 is a cross-sectional view of the transfer substrate along the A-A' line in FIG. 1 according to another embodiment. FIG. 31 is a plan view of the sidewall of the groove according to another embodiment of the present disclosure. FIG. 32 is a cross-sectional view of the transfer substrate along the A-A' line in FIG. 1 according to another embodiment. The sidewall 1021 of the groove 102 defines at least one of a pit 1023 and a line groove 1024 that are recessed towards a side away from the center of the groove 102.

FIG. 29 and FIG. 30 show that the sidewall 1021 of the groove 102 defines a pit 1023 that is recessed towards the side away from the center of the groove 102. The pit 1023 is not limited in shape and number herein. FIG. 29 and FIG. 30 are for schematic illustration only. FIG. 31 and FIG. 32 show that the sidewall 1021 of the groove 102 defines a line groove 1024 that is recessed towards the side away from the center of the groove 102. The line groove 1024 in FIG. 31 is only one example, and may also be curved, which is not limited herein.

In the embodiments of the present disclosure, the sidewall 1021 of the groove 102 defines both a pit 1023 and a line groove 1024 that are recessed towards a side away from the center of the groove 102, which is not described in detail herein.

In the embodiments of the present disclosure, the pit 1023 and the line groove 1024 may be formed by etching, which is not limited herein.

In this embodiment, the pit 1023 or the line groove 1024 is formed on the sidewall 1021 of the groove 102 in order to increase the contact area, to increase the friction, specifically, to increase the contact area between the second functional layer 30 extending to the sidewall 1021 of the groove 102 and the sidewall 1021 of the groove 102. In this way, the friction experienced by the second functional layer 30 can be further increased, thereby further preventing a second functional layer 30 on a neighboring protrusion 101 from being affected by deformation of the current second functional layer 30.

It should be noted that the pit 1023 or the line groove 1024 extends toward a direction intersecting with the fourth direction F4 (i.e., the direction perpendicular to the plane in which the substrate body 10 extends). Since the microdevice 40 is released along the fourth direction F4 (i.e., the direction perpendicular to the plane in which the substrate body 10 extends), the pit 1023 or the line groove 1024 extending towards the direction intersecting with the fourth direction F4 has better performance in increasing the friction, to reduce the displacement of the second functional layer 30 at the edge of the protrusion 101 in the fourth direction F4 while achieving the above beneficial effects. Therefore, in the fourth direction F4 the deformation of the second functional layer 30 near the edge of the protrusion 101 is further lighter than that of the second functional layer 30 facing the center of the protrusion 101. That is, the second functional layer 30 facing the center of the microdevice 40 protrudes more, and the microdevice 40 may fall at its target position after release, to solve the problem that the microdevice 40 is displaced due to the fact that the second functional layer 30 fails to protrude right towards the center of the microdevice 40.

Figure 33:
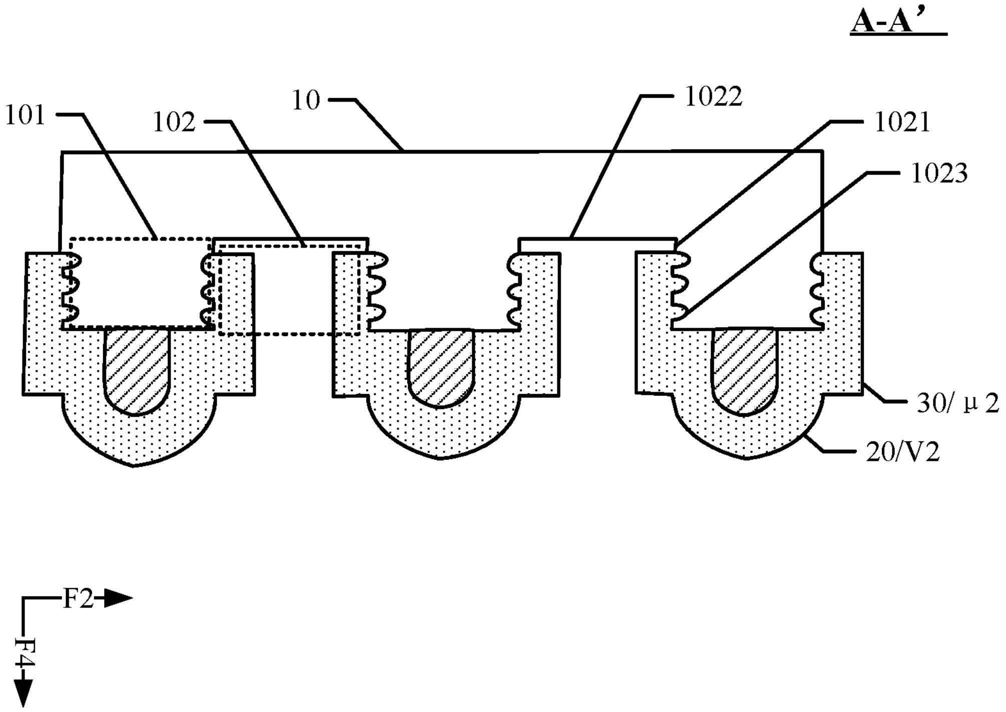
FIG. 33 is a cross-sectional view of the transfer substrate along the A-A' line in FIG. 1 according to another embodiment.
Figure 34:
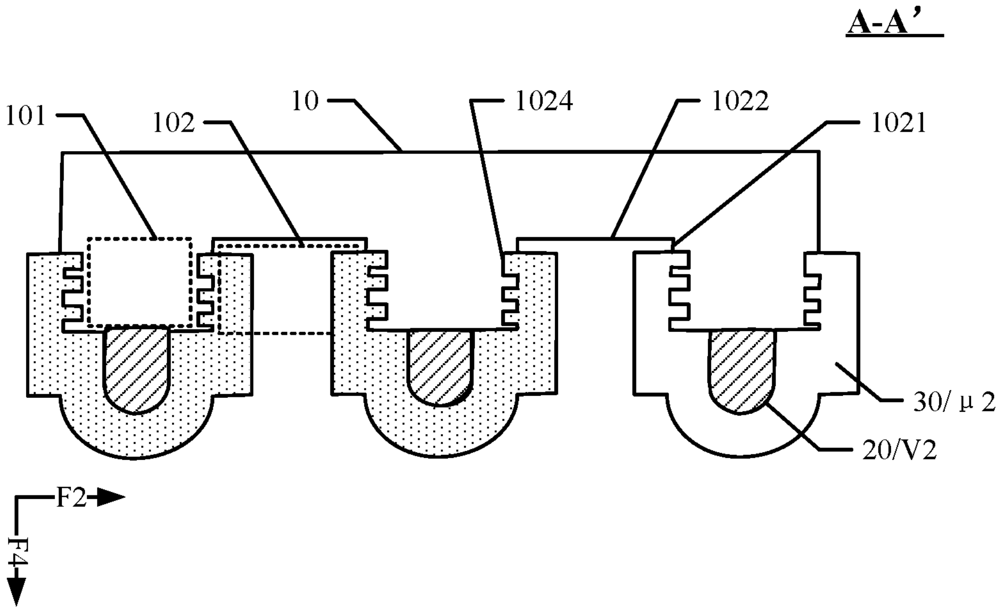
FIG. 34 is a cross-sectional view of the transfer substrate along the A-A' line in FIG. 1 according to another embodiment.

FIGS. 33 and 34 show some embodiments. FIG. 33 is a cross-sectional view of the transfer substrate along the A-A' line in FIG. 1 according to another embodiment. FIG. 33 illustrates an example in which the first functional layer 20 is in the second state. FIG. 34 is a cross-sectional view of the transfer substrate along the A-A' line in FIG. 1 according to another embodiment. FIG. 34 illustrates an example in which the first functional layer 20 is in the second state. The first functional layer 20 switches between a first state and a second state. The volume of the first functional layer 20 is V1 in the first state and is V2 in the second state, and V2 is greater than V1. In the second state, the second functional layer 30 protrudes toward the side away from the protrusion 101. In a direction parallel to the plane in which the substrate body 10 extends, the second functional layer 30 overlaps at least one of the pit 1023 and the line groove 1024. In the second state, the second functional layer 30 is in contact with at least one of the pit 1023 and the line groove 1024.

In the embodiments of the present disclosure, the first functional layer 20 is made of heat-expandable material or gasifiable material. The first functional layer 20 corresponding to the protrusion 101 is subjected to light, heat or the like, and then switches from the first state to the second state. The volume of the first functional layer 20 is increased from V1 to V2 accordingly. Due to the increase in volume of the first functional layer 20, the second functional layer 30 deforms, protruding towards the side away from the protrusion 101. The microdevice 40 is in less contact with the second functional layer 30 due to the deformation of the second functional layer 30, and therefore to be released.

It should be noted that the details about the pit 1023 and the line groove 1024 can refer to FIG. 29 and FIG. 31, and thus are not repeated here. In the embodiments of the present disclosure, the second functional layer 30 in the second state is in direct contact with the pit 1023 and the line groove 1024, which is an optimal solution to increase the friction.

In some embodiments, the first functional layer 20 also extends to the sidewall 1021 of the groove 102 (not shown in FIGS. 30 to 34). In this case, the first functional layer 20 is in contact with the pit 1023 or the line groove 1024. Thanks to the pit 1023 or the line groove 1024, the contact area between the first functional layer 20 and the sidewall 1021 of the groove 102 can be increased, to increase the friction between the sidewall 1021 of the groove 102 and the first functional layer 20. The second functional layer 30 is arranged on a side of the first functional layer 20 away from the protrusion 101, and there is friction between the second functional layer 30 and the first functional layer 20. Therefore, the friction between the first functional layer 20 and the second functional layer 30 can prevent the second functional layer 30 from being displaced in the fourth direction F4 when the second functional layer 30 is subjected to pull. The friction between the first functional layer 20 and the sidewall 1021 of the groove 102 further prevents the first functional layer 20 from being displaced in the fourth direction F4, to indirectly prevent the second functional layer 30 from being displaced in the fourth direction F4.

In this embodiment, the pit 1023 or the line groove 1024 is formed on the sidewall 1021 of the groove 102 in order to increase the contact area. In the second state, the second functional layer 30 protrudes towards the side away from the protrusion 101, referring to FIG. 33 and FIG. 34. In the direction (i.e., the second direction F2 in FIG. 33 and FIG. 34) parallel to the plane in which the substrate body 10 extends, the second functional layer 30 overlaps at least one of the pit 1023 and the line groove 1024. In the second state, the second functional layer 30 is in contact with at least one of the pit 1023 and the line groove 1024, to increase the friction, specifically, to increase the contact area between the second functional layer 30 extending to the sidewall 1021 of the groove 102 and the sidewall 1021 of the groove 102. In this way, the friction experienced by the second functional layer 30 can be further increased, to prevent a second functional layer 30 on a neighboring protrusion 101 from being affected by deformation of the current second functional layer 30. Further, the displacement of the second functional layer 30 at the edge of the protrusion 101 in the fourth direction F4 is reduced. Therefore, in the fourth direction F4 the deformation of the second functional layer near the edge of the protrusion 101 is further lighter than that of the second functional layer facing the center of the protrusion 101. That is, the second functional layer 30 facing the center of the microdevice 40 protrudes more, and the microdevice 40 may fall at its target position after release, to solve the problem that the microdevice 40 is displaced due to the fact that the second functional layer 30 fails to protrude right towards the center of the microdevice 40.

Figure 35:
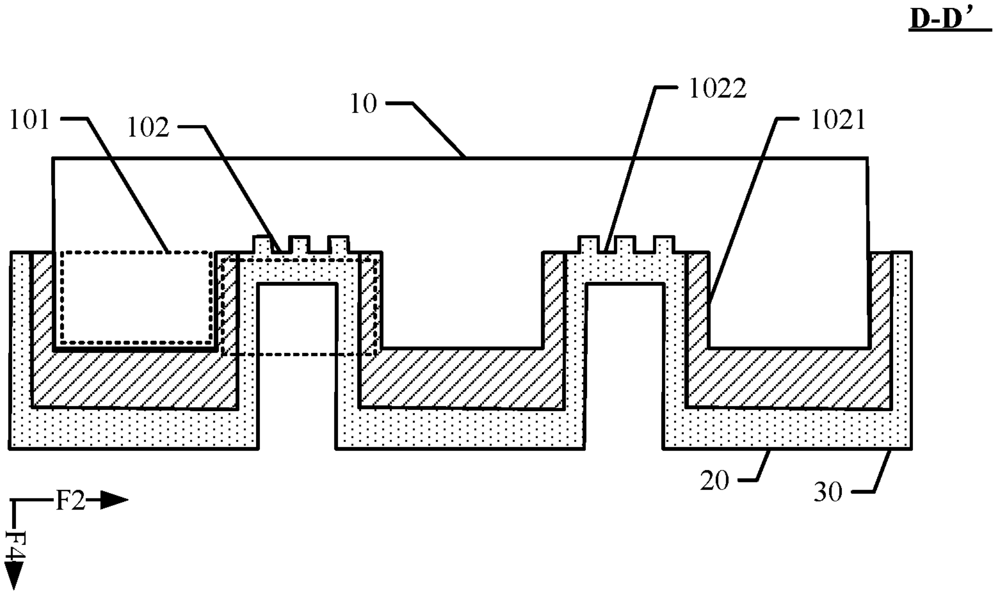
FIG. 35 is a cross-sectional view of the transfer substrate along the D-D' line in FIG. 9 according to another embodiment.
Figure 36:
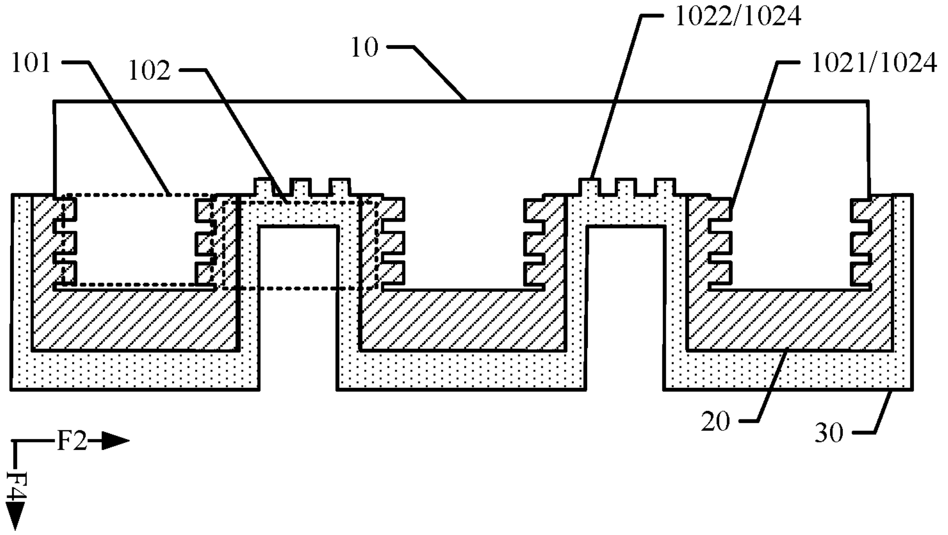
FIG. 36 is a cross-sectional view of the transfer substrate along the D-D' line in FIG. 9 according to another embodiment.

FIGS. 35 and 36 show some embodiments. FIG. 35 is a cross-sectional view of the transfer substrate along the D-D' line in FIG. 9 according to another embodiment. FIG. 36 is a cross-sectional view of the transfer substrate along the D-D' line in FIG. 9 according to another embodiment. At least one of a pit 1023 and a line groove 1024 that is recessed towards a side away from the center of the groove 102 is formed at the bottom 1022 of the groove 102.

FIG. 35 only shows an example in which a line groove 1024 recessed towards the side away from the center of the groove 102 is formed at the bottom 1022 of the groove 102. In another embodiment, a pit 1023 recessed towards the side away from the center of the groove 102 is formed at the bottom 1022 of the groove 102 (not shown in FIGS. 35 and 36). FIG. 36 shows an example in which both the sidewall 1021 of the groove 102 and the bottom 1022 of the groove 102 are provided with line grooves 1024 recessed towards the side away from the center of the groove 102. In another embodiment, both the sidewall 1021 of the groove 102 and the bottom 1022 of the groove 102 are provided with pits 1023 recessed towards the side away from the center of the groove 102.

As shown in FIGS. 35 and 36, the first functional layer 20 extends to the sidewall 1021 of the groove 102, and the second functional layer 30 extends to the bottom 1022 of the groove 102.

In FIG. 35, the second functional layer 30 extends to the bottom 1022 of the groove 102. The bottom 1022 of the groove 102 is provided with a line groove 1024 recessed towards a side away from the center of the groove 102. In this case, the contact area between the bottom 1022 of the groove 102 and the second functional layer 30 increases. Both the friction between the second functional layer 30 and the first functional layer 20 and the friction between the second functional layer 30 and the bottom 1022 of the groove 102 resist the pull subjected to the second functional layer 30 in the fourth direction F4. Since the bottom 1022 of the groove 102 is provided with the line groove 1024 (or pit 1023 not shown in FIGS. 35 to 36), the friction between the second functional layer 30 and the bottom 1022 of the groove 102 is greater, to prevent the deformation of the second functional layer 30 from affecting a second functional layer 30 on a neighboring protrusion 101. In addition, the displacement of the second functional layer 30 near the edge of the protrusion 101 is further reduced, and the microdevice 40 may fall at its target position after release, to solve the problem that the microdevice 40 is displaced due to the fact that the second functional layer 30 fails to protrude right towards the center of the microdevice 40.

In FIG. 36, the first functional layer 20 extends to the sidewall 1021 of the groove 102, which is provided with the line groove 1024 recessed towards the side away from the center of the groove 102. The contact area between the first functional layer 20 and the sidewall 1021 of the groove 102 is increased, and therefore the friction between the first functional layer 20 and the sidewall 1021 of the groove 102 is increased accordingly. The second functional layer 30 is arranged on a side of the first functional layer 20 away from the protrusion 101. The friction, parallel to the sidewall 1021 of the groove 102, between the second functional layer 30 and the first functional layer 20 resists the pull subjected to the second functional layer 30 in the fourth direction F4, and the friction between the first functional layer 20 and the sidewall 1021 of the groove 102 also indirectly resists the pull subjected to the second functional layer 30 in the fourth direction F4, to prevent the deformation of the second functional layer 30 from affecting a second functional layer 30 on a neighboring protrusion 101. In addition, the second functional layer 30 extends to the bottom 1022 of the groove 102, which is provided with the line groove 1024 recessed towards the side away from the center of the groove 102. In this case, the contact area between the bottom 1022 of the groove 102 and the second functional layer 30 is increased, and therefore the friction between the bottom 1022 of the groove 102 and the second functional layer 30 is increased accordingly. The deformation of the second functional layer 30 is further restricted by the friction between the second functional layer 30 and the bottom 1022 of the groove 102, to prevent the deformation of the second functional layer 30 from affecting a second functional layer 30 on a neighboring protrusion 101.

Referring to FIG. 2 and FIG. 21, in some embodiments, a width of the groove 102 in a third direction F3 is w. The third direction F3 is parallel to the plane in which the substrate body 10 extends. A depth of the groove 102 in the direction perpendicular to the plane in which the substrate body 10 extends is h, and h is smaller than w.

The third direction F3 here is parallel to the plane in which the substrate body 10 extends. In FIG. 1, the groove 102 extends along the first direction F1, and therefore the width w of the groove 102 refers to a width in the second direction F2. The third direction F3 is parallel to the second direction F2. In FIG. 19, the grooves 102 are spaced in both the first direction F1 and the second direction F2, and therefore the width w of the groove 102 indicates a width along the first direction F1 and a width along the second direction F2. The third direction F3 in FIG. 19 indicates a direction parallel to the first direction F1 and a direction parallel to the second direction F2. FIG. 21 shows the width of the groove 102 in the first direction F1.

It can be understood that the groove 102 is provided for the purpose of reducing the displacement of the second functional layer 30 caused by pull. Therefore, the farther the distance in the third direction F3 between two adjacent protrusions 101 is, the less the second functional layer 30 corresponding to one of the two protrusions 101 is affected by the deformation of the second functional layer 30 corresponding to the other protrusion 101. In this regard, the width w of the groove 102 in the third direction F3 is as large as possible on the premise of fulfilling requirements on the number of the microdevices 40 to be mass-transferred.

In addition, a small depth of the groove 102 in the direction perpendicular to the plane in which the substrate body 10 extends may result in poor performance. Therefore, the groove 102 is as deep as possible along the direction perpendicular to the plane in which the substrate body 10 extends. However, an excessively deep groove 102 may increase the manufacturing difficulty.

In this embodiment, h is smaller than w. The width w of the groove 102 in the third direction F3 is as large as possible and the depth h of the groove 102 is slightly smaller in order to reduce the manufacturing difficulty while reducing the displacement of the second functional layer 30 caused by the pull.

In some embodiments, a ratio h/w of the depth to the width of the groove 102 is greater than 0.5, as shown in FIG. 2 and FIG. 21.

In these embodiments, h/w is greater than 0.5. The width w of the groove 102 in the third direction F3 is large enough and the depth h of the groove 102 is not too large, not only reducing the manufacturing difficulty but also reducing the displacement of the second functional layer 30 resulted from the pull.

In some embodiments, the width of the groove 102 in the third direction F3 is w, and the third direction F3 is parallel to the plane in which the substrate body 10 extends, as shown in FIG. 2 and FIG. 21. w is greater than or equal to 50 μm and less than or equal to 200 μm.

It should be understood that the width w of the groove 102 in the third direction F3 is as large as possible in order to reduce the displacement of the second functional layer 30 due to the pull. An excessively small width w of the groove 102 in the third direction F3 may fail to reduce the displacement of the second functional layer 30 due to the pull.

However, the width w of the groove 102 in the third direction F3 may not too large. An excessively large width w of the groove 102 in the third direction F3 may result in a decrease in the number of the protrusions 101 for the substrate body 10 in a size, failing to fulfilling the requirements on the number of the microdevices 40 to be picked up by the second functional layer 30 in the subsequent mass transfer. This may result in low production efficiency.

In these embodiments, w is greater than or equal to 50 μm and less than or equal to 200 μm, not only the displacement of the second functional layer 30 due to the pull can be reduced but also the production requirements can be met, to improve the production efficiency.

In some embodiments, in the third direction F3 the width of the groove 102 is w and a width of the protrusion 101 is d, as shown in FIG. 2 and FIG. 21. w is less than d. The third direction F3 is parallel to the plane in which the substrate body 10 extends.

It should be understood that the protrusion 101 is to pick a microdevice 40 up and then release the microdevice 40. Therefore, the area of the protrusion 101 should be slightly larger especially larger than the area of the microdevice 40 for the sake of success in picking the microdevice 40 up. The groove 102 is provided in order to reduce the displacement of the second functional layer 30 due to the pull, and may not too large in size as long as the displacement of the second functional layer 30 can be reduced. The excessively large width w of the groove 102 in the third direction F3, i.e., an excessively large orthographic projection of the groove 102 on the plane in which the substrate body 10 extends, results in limited space for the protrusion 101 with respect to a substrate body 10 in a size. In this case, the size of the protrusion 101 has to be reduced in order to fulfil requirements on the number of the microdevices 40 to be mass-transferred, resulting in low reliability of picking up a microdevice 40.

In these embodiments, w is less than d, and the size of the protrusion 101 is sufficient to pick the microdevice 40 up while reducing the displacement of the second functional layer 30 due to the pull, to improve the reliability of picking up the microdevice 40.

In some embodiments, w/d is greater than 0.2, as shown in FIGS. 2 and 21.

As described above, the excessively large width w of the groove 102 in the third direction F3, i.e., the excessively large orthographic projection of the groove 102 on the plane in which the substrate body 10 extends, results in limited space for the protrusion 101 with respect to a substrate body 10 in a size. In this case, the size of the protrusion 101 has to be reduced in order to fulfil requirements on the number of the microdevices 40 to be mass-transferred, resulting in low reliability of picking up a microdevice 40. On the other hand, an excessively small width w of the groove 102 in the third direction F3 results in low performance of reducing the displacement of the second functional layer 30 due to the pull. In these embodiments, w/d is greater than 0.2 and w is less than d, not only the displacement of the second functional layer 30 due to the pull can be successfully reduced but also the size of the protrusion 101 is sufficient to pick the microdevice 40 up, to improve the reliability of picking up the microdevice 40.

In some embodiments, the first functional layer 20 includes a first part 201 and a second part 202, as shown in FIG. 12. In the direction perpendicular to the plane in which the substrate body 10 extends, the first part 201 overlaps the protrusion 101, the second part 202 overlaps the groove 102, and the first part 201 is thicker than the second part 202.

It should be noted that, the second part 202 of the first functional layer 20 overlaps the groove 102 in the direction perpendicular to the plane in which the substrate body 10 extends. The first functional layer 20 may be formed on the substrate body 10 by way of glue application. Here, a tool that can be inserted into the groove 102 may be essential to attach the first functional layer 20 to the bottom 1022 of the groove 102. In other embodiments, the first functional layer 20 may be formed by spin coating.

In FIG. 12, the first functional layer 20 extends from the protrusion 101 to the sidewall 1021 of the groove 102, and thence to the bottom 1022 of the groove 102. In the direction perpendicular to the plane in which the substrate body 10 extends, the first part 201 covers the protrusion 101, and the second part 202 overlaps the groove 102. The first part 201 covering the protrusion 101 increases in volume in the second state (as shown FIG. 18). Therefore, for the first functional layer 20, the increase in volume in the second state depends on the thickness of the first part 201. The thicker the first part 201 is, the more the volume increases in the second state, which increases the deformation of the second functional layer and therefore facilitates the release of the microdevice 40. In this embodiment, the first part 201 is thicker than the second part 202 in the direction perpendicular to the plane in which the substrate body 10 extends, which increases the deformation of the second functional layer 30, to facilitate the release of the microdevice 40.

Further, the second functional layer 30 is subjected to the pull in the fourth direction F4 (i.e., the direction perpendicular to the plane in which the substrate body 10 extends). Therefore, the part of the second functional layer 30 overlapping the protrusion 101 protrudes towards the side away from the protrusion 101, and the part of the second functional layer 30 on the sidewall 1021 of the groove 102 is displaced in the fourth direction F4 due to the pull. The friction between the second functional layer 30 and the first functional layer 20 in the extending direction of the sidewall 1021 of the groove 102 helps to reduce a distance by which the second functional layer 30 to be displaced in the second direction F2. The thinner the second part 202 overlapping the bottom 1022 of the groove 102 is, the better the performance of reducing the displacement of the second functional layer 30 in the second direction F2 is. This is because the first functional layer 20 is to be pulled when the second functional layer 30 deforms, and a thinner second part 202 in the direction perpendicular to the plane in which the substrate body 10 extends helps to firmly attach the second part 202 to the bottom 1022 of the groove 102, and therefore the bottom 1022 is less likely to be displaced due to the pull in the fourth direction F4.

FIGS. 6 and 10 illustrate some embodiments. The first functional layer 20 includes a first part 201 and a hollow part. In the direction perpendicular to the plane in which the substrate body 10 extends, the first part 201 overlaps the protrusion 101, and the hollow part overlaps the groove 102.

In these embodiments, the first functional layer 20 is formed on only the top of the protrusion 101 and does not extend to the groove 102. In FIG. 6 and FIG. 10, the first functional layer 20 includes a hollow part and a first part 201. In the direction perpendicular to the plane in which the substrate body 10 extends, the first part 201 overlaps the protrusion 101, and the hollow part overlaps the groove 102. In FIG. 10, the second functional layer 30 is in direct contact with the bottom 1022 of the groove 102, and the friction between the second functional layer 30 and the bottom 1022 of the groove 102 can reduce the displacement of the second functional layer 30 in the fourth direction F4, to prevent a second functional layer 30 on a neighboring protrusion 101 from being affected by deformation of the current second functional layer 30. In FIG. 6, the second functional layer 30 fails to extend to the bottom 1022 of the groove 102 in the direction perpendicular to the plane in which the substrate body extends. That is, second functional layers 30 are spaced apart along the second direction F2, to prevent a second functional layer 30 on a neighboring protrusion 101 from being affected by deformation of the current second functional layer 30. In the embodiments of the present disclosure, second functional layers 30 are spaced apart along both the first direction F1 and the second direction F2, to prevent a second functional layer 30 on a neighboring protrusion 101 from being affected by deformation of the current second functional layer 30.

In theses embodiments, in order to transfer a microdevice 40 on a protrusion 101, only the first part 201 of the first functional layer 20 corresponding to the protrusion 101 serves the deformation of the second functional layer 30, while the hollow part of the first functional layer 20 at the bottom 1022 of the groove 102 fails to function. Therefore, the first part 201 overlaps the protrusion 101 and the hollow part overlaps the groove 102 in the direction perpendicular to the plane in which the substrate body 10 extends, and the second functional layer 30 on the protrusion 101 can deform to release the microdevice 40 with less usage of materials. It is unnecessary to form the first functional layer 20 in the groove 102 by spin coating or pasting the material form which the first functional layer 20 is made, to reduce the cost and simplifying the manufacturing process when manufacturing the first functional layer 20.

In some embodiments, the second functional layer 30 includes a third part 301 and a fourth part 302, as shown in FIG. 4. In the direction perpendicular to the plane where the substrate body 10 extends, the third part 301 overlaps the protrusion 101, the fourth part 302 overlaps the groove 102, and a thickness m1 of the third part 301 is smaller than a thickness m2 of the fourth part 302.

In FIG. 4, the second functional layer 30 extends from the protrusion 101 to the sidewall 1021 of the groove 102 and thence to the bottom 1022 of the groove 102. In the direction perpendicular to the plane where the substrate body 10 extends, the third part 301 overlaps the protrusion 101, the fourth part 302 overlaps the groove 102, and the thickness m1 of the third part 301 is smaller than the thickness m2 of the fourth part 302.

It should be understood that the third part 301 is for picking a microdevice 40 up and then releasing the microdevice 40. In the case that the second functional layer 30 extends to the bottom 1022 of the groove 102, the thickness m2 of the fourth part 302 is as large as possible in order to prevent a second functional layer 30 on a neighboring protrusion 101 from being affected. In these embodiments, the thickness m1 of the third part 301 is smaller than the thickness m2 of the fourth part 302 in the direction perpendicular to the plane where the substrate body 10 extends, and the fourth part 302 can be firmly attached to the bottom 1022 of the groove 102 to increase the friction between the fourth part 302 and the bottom 1022 of the groove 102, to prevent a second functional layer 30 on a neighboring protrusion 101 from being affected.

In some embodiments, an alignment mark 50 is formed on the substrate body 10, as shown in FIGS. 1 and 3. The alignment mark 50 may be circular, square, or cross-shaped.

FIG. 1 only shows an example in which the alignment mark 50 is circular. FIG. 3 only shows an example in which the alignment mark 50 is cross-shaped. In other embodiments, the alignment mark 50 is square. The shape of the alignment mark 50 is not limited herein.

It should be understood that, the protrusion 101 is heated by laser or the like in order to transfer a microdevice 40, to increase the first functional layer 20 corresponding to the protrusion 101 in volume. Then, the second functional layer 30 corresponding to the protrusion 101 protrudes, to release the microdevice 40. In order to heat the protrusion 101 by laser, the transfer substrate 1000 is placed on a platform, a laser spot on the side of the substrate body 10 away from the protrusion 101 automatically searches for the alignment mark 50 to position the transfer substrate 1000 and then confirms a position of the protrusion 101 on the substrate body 10. Finally, the laser spot is turned on, directly facing the protrusion 101.

In the present disclosure, the alignment mark 50 is formed on the substrate body 10, which is beneficial to accurately locate a protrusion 101 on the transfer substrate 1000, and the protrusion 101 can be accurately heated by laser.

In some embodiments, referring to FIG. 1 to FIG. 15 and FIG. 19 to FIG. 26, the first functional layer 20 is made of at least one of polyimide, acrylic material, epoxy material, or silica gel.

It should be understood that the polyimide, the acrylic material, or the epoxy material switches to a second state when being heated by laser or the like. In the second state, carbon bonds are broken to generate gas including carbon dioxide and hydrogen with small molecules, and the volume of the first functional layer 20 increases, prompting the second functional layer 30 to protrude towards the side away from the protrusion 101 to release the microdevice. It should be understood that the volume of the gas depends on the energy of the laser. The greater the energy of the laser is, the greater the volume of the gas is, the more the second functional layer 30 protrudes, and thus is more conducive to the release of the microdevice.

It should be understood that the silica gel switches to a second state when being heated by laser or the like. The silica gel expands in the second state, prompting the second functional layer 30 to protrude towards the side away from the protrusion 101 to release the microdevice. It should be understood that the increase in volume of the silica gel after expansion depends on the energy of the laser. The greater the energy of the laser is, the greater the volume of the silica gel increases after expansion, and the more the second functional layer 30 protrudes, and thus is more conducive to the release of the microdevice.

Figure 37:
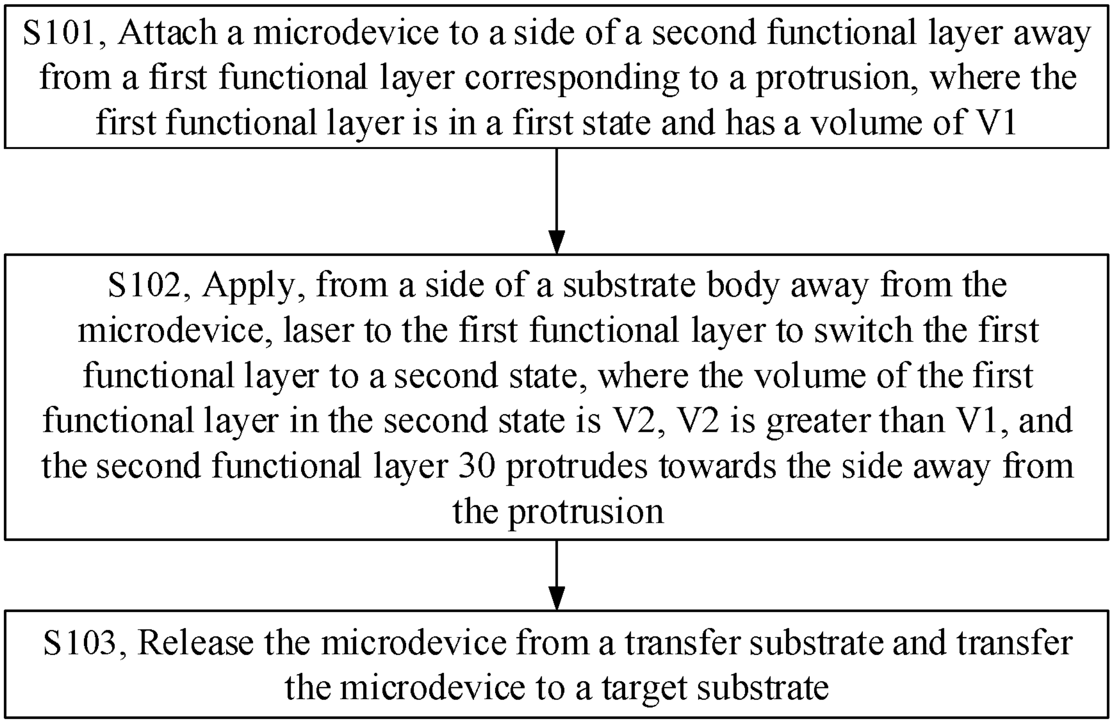
FIG. 37 is a flow chart illustrating a method for transferring a microdevice according to the present disclosure.

Based on the embodiment of a method for transferring a microdevice 40 is further provided according to the present disclosure. This method is applied to the transfer substrate 1000 according to any one of the above embodiments and a target substrate 60. The target substrate 60 is arranged opposite to the transfer substrate 1000. The transfer substrate 1000 may refer to any one of the embodiments in FIGS. 1 to 15 and FIGS. 17 to 36. The transfer substrate 1000 includes a substrate body 10, a first functional layer 20 and a second functional layer 30. Protrusions 101 and grooves 102 are formed alternately on one side of the substrate body 10. The first functional layer 20 is arranged on the side of the substrate body 10 where the protrusion 101 is formed. The first functional layer 20 at least partially overlaps the protrusion 101 along a direction perpendicular to a plane in which the substrate body 10 extends. The second functional layer 30 is arranged on a side of the first functional layer 20 away from the substrate body 10. The second functional layer 30 at least partially overlaps the first functional layer 20 along the direction perpendicular to the plane in which the substrate body 10 extends. The second functional layer 30 extends from the protrusion 101 at least to a sidewall 1021 of the groove 102. Reference is made to FIG. 37, which is a flow chart illustrating the method for transferring a microdevice according to the present disclosure. The method for transferring a microdevice includes the following steps S101 to S103.

In S101, a microdevice 40 is attached to a side of a second functional layer 30 away from a first functional layer 20 corresponding to a protrusion 101. The first functional layer 20 is in a first state and has a volume of V1.

In S102, the first functional layer 20 corresponding to the protrusion 101 is subjected to laser from a side of the substrate body 10 away from the microdevice 40, and therefore switches to a second state. In the second state, the volume of the first functional layer 20 is V2, V2 is greater than V1, and the second functional layer 30 protrudes towards the side away from the protrusion 101.

In S103, the microdevice 40 is released from the transfer substrate 1000 and transferred to the target substrate 60.

Referring to FIG. 4, in S101, the microdevice 40 is attached to the side of the second functional layer 30 away from the first functional layer 20 corresponding to the protrusion 101. In the embodiments of the present disclosure, the microdevice 40 is attached to the side of the second functional layer 30 away from the first functional layer 20 through an adhesive layer. Alternatively, the second functional layer 30 itself has adhesiveness, and therefore is pasted to the side of the second functional layer 30 away from the first functional layer 20 when being picked up. In FIG. 4, the first functional layer 20 is in the first state and has the volume is V1, before being subjected to laser or the like.

It should be noted that, in the direction perpendicular to the plane in which the substrate body 10 extends, the protrusion 101 is larger than the microdevice 40 in size, and the protrusion 101 can reliably pick the microdevice 40 up. In a case that the protrusion 101 is smaller than the microdevice 40 in size, the microdevice 40 picked up by the protrusion 101 may easily fall off because the microdevice 40 cannot be completely attached to the protrusion 101, resulting in low reliability of picking up the microdevice 40.

In S102, reference is made to FIG. 17 which illustrates an example where a microdevice 40*a* on a protrusion 101*a* is to be released. The first functional layer 20 is subjected to laser from the side of the substrate body 10 away from the microdevice 40. The first functional layer 20 switches to the second state. The volume of the first functional layer 20*a* corresponding to the protrusion 101*a* increases to V2, and V2 is greater than V1. The second functional layer 30*a* corresponding to the protrusion 101*a* protrudes to the side away from the protrusion 101. In the present disclosure, the groove 102 is formed between protrusions 101 and the second functional layer 30 extends to the sidewall 1021 of the groove 102. Therefore, the friction between the second functional layer 30 and the sidewall 1021 of the groove 102 reduces the displacement of the second functional layer 30 due to the pull, less affecting second functional layers 30 on neighboring protrusions 101*b* and 101*c*. That is, the second functional layers 30 on the neighboring protrusions 101*b* and 101*c* less likely deform due to the pull, to avoid the displacement of the microdevices 40*b* and 40*c* when being released.

Figure 38:
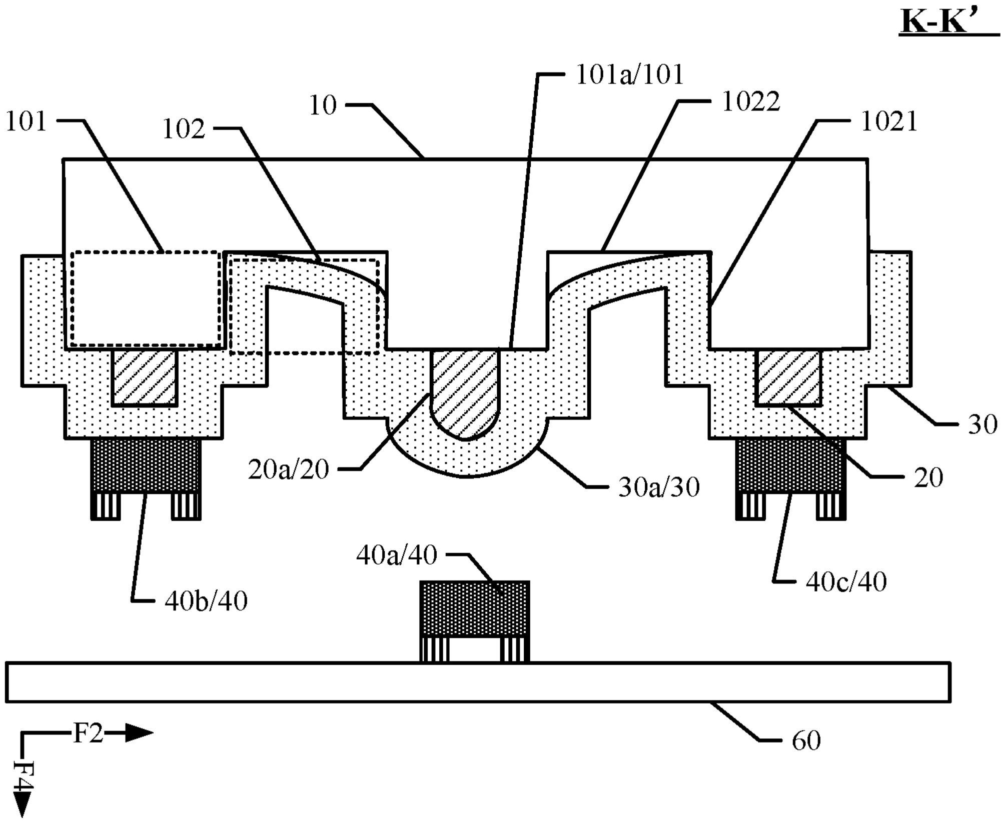
FIG. 38 is a cross-sectional view illustrating a transfer substrate and a target substrate corresponding to step S103 in FIG. 37.

In S103, reference is made to FIG. 38 which is a cross-sectional view illustrating the transfer substrate 1000 and the target substrate 60 corresponding to step S103. The microdevice 40 is released from the transfer substrate 1000 and then transferred to the target substrate 60. In FIG. 38, the target substrate 60 is not pattern filled. In the embodiments of the present disclosure, the target substrate 60 may be a transitional substrate 10. The microdevice is transferred onto the transitional substrate 10, and then bonded on an array substrate 10 of the display panel 2000. In the embodiments of the present disclosure, the target substrate 60 is an array substrate 10 of the display panel 2000. Due to high precision in release in the present disclosure, the microdevice 40 is directly released onto the array substrate 10 to which the microdevice 40 is to be bonded, and thus no transitional substrate body 10 involves in this case.

In addition, microdevices 40 can be transferred selectively according to the present disclosure. The second functional layer 30 corresponding to the protrusion 101 picks up a microdevice 40 which is to be attached to the second functional layer 30, and then deforms or its viscosity is reduced when the first functional layer 20 corresponding to the protrusion 101 is subjected to light, heat or the like, to release the microdevice 40. The first functional layer corresponding to which protrusion 101 is subjected to light, heat or the like depends on a target microdevice 40 to be released, and the microdevices 40 can be transferred selectively by comparison with the stamp-based mass transfer.

In some embodiments, referring to FIG. 37, and FIG. 1, FIG. 2 and FIG. 18, in the method for transferring a microdevice 40, the first functional layer 20 is in the first state and the viscosity of the second functional layer 30 is $\mu1$ in S101. In S102, the first functional layer is subjected to laser from the side of the substrate body 10 away from the microdevice 40, the first functional layer 20 switches to the second state, the viscosity of the second functional layer 30 decrease to $\mu2$, and $\mu1$ is greater than $\mu2$.

The first functional layer 20 corresponding to the protrusion 101 is subjected to light, heat or the like, and then switches from the first state to the second state. The volume of the first functional layer 20 is increased from V1 to V2 accordingly. Due to the increase in volume of the first functional layer 20, the second functional layer 30 deforms, protruding towards the side away from the protrusion 101. Further, the viscosity of the second functional layer 30 also decreases from $\mu1$ of the first state to $\mu2$, facilitating detachment of the microdevice 40 from the second functional layer 30.

In some embodiments, referring to FIG. 2, FIG. 18, FIG. 4 and FIG. 17, the second functional layer 30 includes a first surface 3001 and a second surface 3002. In the direction perpendicular to the plane in which the substrate body 10 extends, the first surface 3001 is arranged on a side of the second functional layer 30 close to the first functional layer 20. Corresponding to the protrusion 101, in the direction perpendicular to the plane in which the substrate body 10 extends, a distance between the second surface 3002 and the substrate body before the second functional layer 30 protrudes is c1 and after the second functional layer protrudes is c2, and the microdevice 40 is L in height. A difference between c2 and c1, that is, c2-c1 is c0, where c0 is greater than or equal to 0.5 L and less than or equal to 2 L.

The second functional layer 30 includes a first surface 3001 and a second surface 3002. The first surface 3001 is arranged on a side of the second functional layer 30 close to the substrate body 10. The second surface 3002 is arranged on a side of the second functional layer 30 away from the substrate body 10. The first functional layer 20 corresponding to the protrusion 101 is subjected to light, heat or the like, and then switches from the first state to the second state. The volume of the first functional layer 20 is increased from V1 to V2 accordingly. Due to the increase in volume of the first functional layer 20, the second functional layer 30 deforms, protruding towards the side away from the protrusion 101. The distance between the second surface 3002 and the substrate body 10 is increased from c1 to c2 accordingly. It should be noted that whether the microdevice 40 is to be released easily largely depends on the difference c0 between c2 and c1. The larger the difference c0 between c2 and c1, the more the second functional layer 30 protrudes, and the smaller the contact area between the microdevice 40 and the second functional layer 30 is, and therefore the easier it is to release the microdevice 40. Due to an excessively small difference c0 between c2 and c1, the second functional layer 30 may protrude less, resulting in a large contact area between the microdevice 40 and the second functional layer 30, which is not conducive to the release of the microdevice 40. It is even difficult to release the microdevice 40. In one embodiment, difference c0 between c2 and c1 of the second functional layer 30 does not increase infinitely. This is because the extent to which the second functional layer 30 protrudes depends the increase in volume of the first functional layer 20. The first functional layer 20 corresponding to the protrusion 101 is completely vaporized when being subjected to laser with enough energy and duration. In this case, the volume of the first functional layer 20 reaches the maximum, which corresponds to an upper limit of the increase in the volume of the first functional layer 20. The maximum extent to which the second functional layer 30 protrudes, i.e., the maximum of the difference c0 between c2 and c1, depends on this upper limit. In these embodiments, c0 is greater than or equal to 0.5 L and less than or equal to 2 L for facilitating the release of the microdevice 40.

Figure 39:
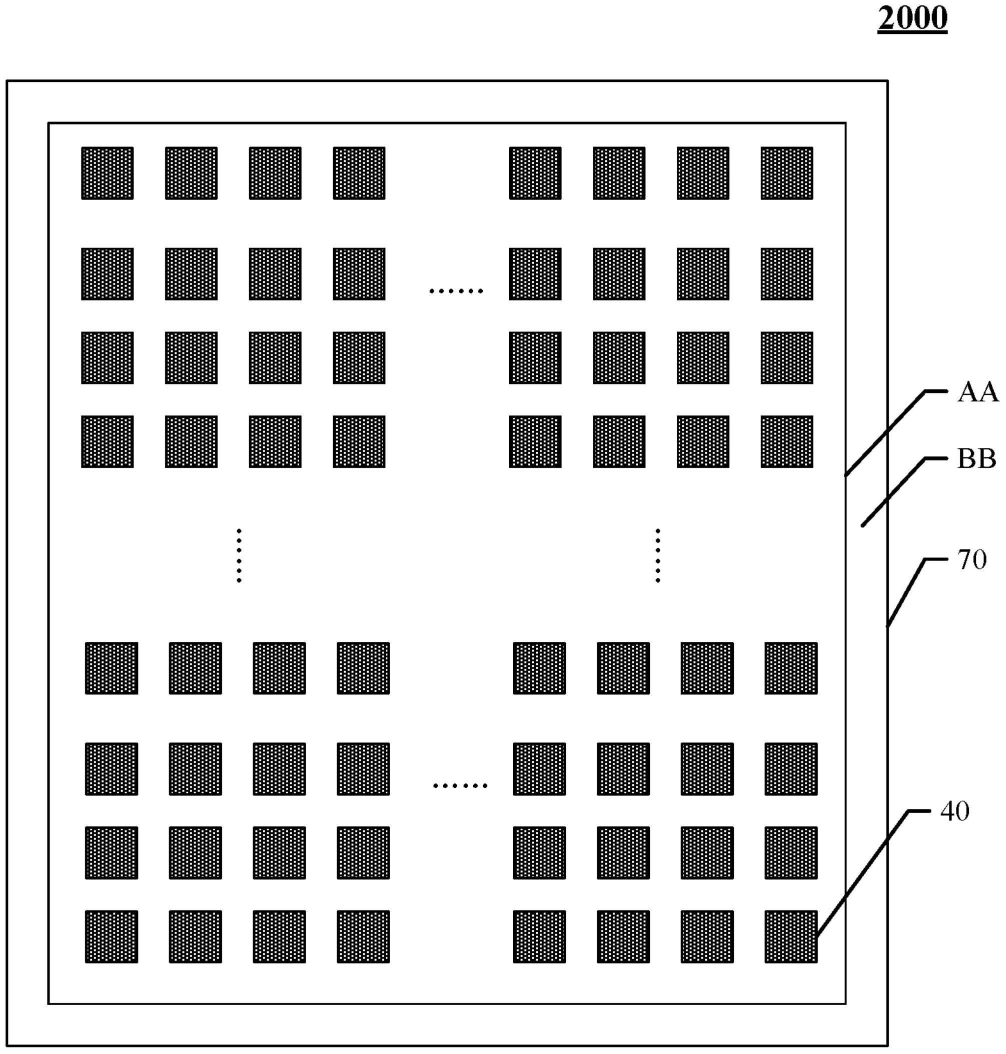
FIG. 39 is a plan view of a display panel according to the present disclosure.

Based on the embodiments, a display panel 2000 is also provided according to the present disclosure. Reference is made to FIG. 39, which is a plan view of the display panel according to the present disclosure. The display panel 2000 includes a substrate 70 and multiple microdevices 40 arranged on one side of the substrate 70. The microdevices 40 are transferred onto the substrate 70 by the method for transferring a microdevice described above.

FIG. 39 shows the substrate 70 and the microdevices 40 on the substrate 70. The number of microdevices 40 in FIG. 39 is for illustration, and is not intended to limit the number of microdevices 40 in actual products. FIG. 39 also shows a display area AA and a non-display area BB surrounding the display area AA.

Figure 40:
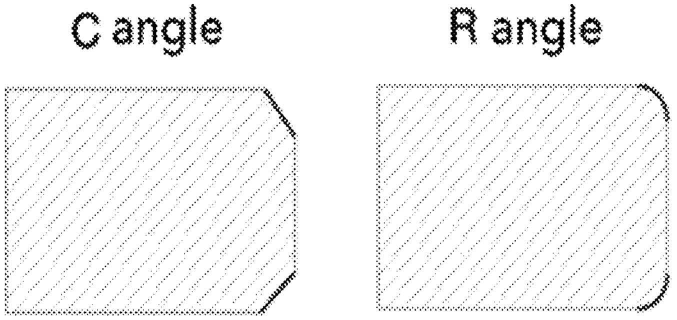
FIG. 40 is a diagram showing a shape of a Mini LED according to the present disclosure.

In some embodiments, the microdevice 40 is a light emitting element, such as the Micro LED or Mini LED. The Micro LED, i.e., micro light-emitting diode, is an LED with a grain size of about 1-100 microns, facilitating a display panel with pixel particles of 0.05 mm or smaller. The Micro LED consumes very little power, and has better material stability and no image retention. The Mini LED, i.e., sub-millimeter light-emitting diode, is an LED with a grain size between 100 microns and 1000 microns. The Mini LED has a high yield rate, special-shaped cutting characteristics, and better color rendering. In one embodiment, the special-shape may be in a rounded (R) angle shape or cut (C) angle shape, as shown in FIG. 40, where the R angle shape is shown at the right portion of FIG. 40 and the C angle shape is shown at the left portion of FIG. 40.

The Mini LED applied to a display panel can provide a finer high dynamic range (HDR) partition for the display panel. It should be understood that using smaller-sized Micro LEDs or Mini LEDs as light-emitting elements can provide fine high dynamic range partitions.

In some embodiments, in the third direction F3, a width of the microdevice 40 is m, a width of the protrusion 101 is d, and d is greater than m, as shown in FIG. 4.

It should be noted that, in the direction perpendicular to the plane in which the substrate body 10 extends, the protrusion 101 is larger than the microdevice 40 in size, and the protrusion 101 can reliably pick the microdevice 40 up. In a case that the protrusion 101 is smaller than the microdevice 40 in size, the microdevice 40 picked up by the protrusion 101 may easily fall off because the microdevice 40 cannot be completely attached to the protrusion 101, resulting in low reliability of picking up the microdevice 40. In the third direction F3, the width d of the protrusion 101 is greater than the width m of the microdevice 40, and the contact area between the microdevice 40 and the protrusion 101 is sufficient to pick the microdevice 40 up, to improve the reliability of picking up the microdevice 40.

It can be known from the above embodiments that the transfer substrate, the method, and the display panel according to the present disclosure achieves at least the following beneficial effects.

The transfer substrate according to the present disclosure includes: a substrate body, a first functional layer and a second functional layer. Protrusions and grooves are alternately formed on one side of the substrate body. The first functional layer is arranged on the side of the substrate body where the protrusion is formed. The first functional layer at least partially overlaps the protrusion along a direction perpendicular to a plane in which the substrate body extends. The second functional layer at least partially overlaps the first functional layer along the direction perpendicular to the plane in which the substrate body extends. The second functional layer at least extends from the protrusion to a sidewall of the groove. The second functional layer corresponding to a protrusion picks up a microdevice which is to be attached to the second functional layer, and then deforms or its viscosity is reduced when the first functional layer corresponding the protrusion is subjected to light, heat or the like, to release the microdevice. In this way, microdevices can be transferred selectively by comparison with the stamp-based mass transfer. Further, release of one target microdevice easily results in a displacement of a neighboring target microdevice according to the conventional technology. This is because the second functional layer corresponding to the target microdevice protrudes in order to release the target microdevice, pulling the neighboring second functional layer. Since the extent to which the neighboring second functional layer protrudes is affected by the pull, the microdevice on the neighboring second functional layer fails to fall on its desired position exactly after release. In the present application, however, the groove is formed between adjacent protrusions, and the second functional layer corresponding to the protrusion extends from the protrusion to at least the sidewall of the groove. Therefore, when the second functional layer protrudes to release the target microdevice, the friction between the second functional layer and the sidewall of the groove can reduce the displacement of the second functional layer in the direction perpendicular to the plane in which the substrate body extends, and a neighboring second functional layer can be prevented being affected by deformation of the current second functional layer, to prevent the microdevice on the neighboring second functional layer from being displaced during release.

What is claimed is:

1. A transfer substrate, comprising:

a substrate body, wherein a side of the substrate body is provided with a protrusion and a groove, and the protrusion alternates with the groove;

a first functional layer, wherein the first functional layer is arranged on the side of the substrate body where the protrusion is formed, and the first functional layer at least partially overlaps the protrusion along a direction perpendicular to a plane in which the substrate body extends; and a second functional layer arranged on a side of the first functional layer away from the substrate body, wherein the second functional layer at least partially overlaps the first functional layer along the direction perpendicular to the plane in which the substrate body extends, and the second functional layer at least extends from the protrusion to a sidewall of the groove, wherein a combination of the first functional layer and the second functional layer is configured to release a microdevice located at a side of the second functional layer away from the substrate body when being illuminated by a light or being heated, wherein when being illuminated by the light or being heated, the first functional layer expands to deform the second functional layer, or viscosity of the second functional layer decreases.

2. The transfer substrate according to claim 1, wherein the first functional layer is configured to switch between a first state and a second state, wherein a volume of the first functional layer is V1 in the first state and is V2 in the second state, V2 is greater than V1, and the second functional layer protrudes towards a side away from the protrusion when the first functional layer is in the second state; and the viscosity of the second functional layer is μ1 when the first functional layer is in the first state and is μ2 when the first functional layer is in the second state, and μ1 is greater than μ2.

3. The transfer substrate according to claim 1, wherein the protrusion extends along a first direction, the groove alternates with the protrusion along a second direction, and the first direction and the second direction are parallel to the plane in which the substrate body extends, and the first direction intersects the second direction.

4. The transfer substrate according to claim 1, wherein the groove alternates with the protrusion along a first direction and a second direction, and the first direction and the second direction are parallel to the plane in which the substrate body extends, and the first direction intersects the second direction.

5. The transfer substrate according to claim 1, wherein an included angle between the sidewall of the groove and a bottom of the groove is less than or equal to 90°.

6. The transfer substrate according to claim 1, wherein the sidewall of the groove is arc-shaped; and/or a bottom of the groove is arc-shaped.

7. The transfer substrate according to claim 1, wherein the sidewall of the groove is provided with at least one of a pit and a line groove that are recessed towards a side away from a center of the groove; or a bottom of the groove is provided with at least one of a pit and a line groove that are recessed towards a side away from a center of the groove.

8. The transport substrate according to claim 7, wherein the first functional layer is configured to switch between a first state and a second state, wherein a volume of the first functional layer is V1 in the first state and is V2 in the second state, V2 is greater than V1, and the second functional layer protrudes towards a side away from the protrusion when the first functional layer is in the second state;

the second functional layer overlaps the pit along a direction parallel to the plane in which the substrate body extends, and/or the second functional layer overlaps the line groove along a direction parallel to the plane in which the substrate body extends; and the second functional layer is in contact with the pit when the first functional layer is in the second state, and/or the second functional layer is in contact with the line groove when the first functional layer is in the second state.

9. The transfer substrate according to claim 1, wherein the groove has a width of w in a third direction, and the third direction is parallel to the plane in which the substrate body extends; and the groove has a depth of h along the direction perpendicular to the plane in which the substrate body extends, and h is smaller than w.

10. The transfer substrate according to claim 9, wherein a ratio h/w of the depth to the width of the groove is greater than 0.5.

11. The transfer substrate according to claim 1, wherein the groove has a width of w in a third direction, the third direction is parallel to the plane in which the substrate body extends, and w is greater than or equal to 50 μm and less than or equal to 200 μm.

12. The transfer substrate according to claim 1, wherein the groove has a width of w and the protrusion has a width of d in a third direction, and w is less than d, wherein the third direction is parallel to the plane in which the substrate body extends.

13. The transfer substrate according to claim 12, wherein w/d is greater than 0.2.

14. The transfer substrate according to claim 1, wherein the first functional layer comprises a first part and a second part, and wherein along the direction perpendicular to the plane in which the substrate body extends, the first part overlaps the protrusion, the second part overlaps the groove, and the first part is thicker than the second part.

15. The transfer substrate according to claim 1, wherein the first functional layer comprises a first part and a hollow part, and wherein along the direction perpendicular to the plane in which the substrate body extends, the first part overlaps the protrusion, and the hollow part overlaps the groove.

16. The transfer substrate according to claim 1, wherein the second functional layer comprises a third part and a fourth part, and wherein along the direction perpendicular to the plane in which the substrate body extends, the third part overlaps the protrusion, the fourth part overlaps the groove, and the third part is thinner than the fourth part.

17. A method for transferring a microdevice, wherein the method is applied to a transfer substrate and a target substrate, the target substrate is arranged opposite to the transfer substrate; the transfer substrate comprises a substrate body, a first functional layer and a second functional layer, a side of the substrate body is provided with a protrusion and a groove, and the protrusion alternates with the groove, the first functional layer is arranged on the side of the substrate body where the protrusion is formed, the first functional layer at least partially overlaps the protrusion along a direction perpendicular to a plane in which the substrate body extends, the second functional layer is arranged on a side of the first functional layer away from the substrate body, the second functional layer at least partially overlaps the first functional layer along the direction perpendicular to the plane in which the substrate body extends, and the second functional layer extends from the protrusion to at least a sidewall of the groove, and wherein the method comprises:

attaching the microdevice onto a side of the second functional layer away from the first functional layer corresponding to the protrusion, wherein the first functional layer is in a first state and has a volume of V1;

applying, from a side of the substrate body away from the microdevice, laser to the first functional layer corresponding to the protrusion to switch a state of the first functional layer to a second state, wherein the volume of the first functional layer in the second state is V2, V2 is greater than V1, and the second functional layer protrudes towards a side away from the protrusion; and releasing the microdevice from the transfer substrate and transferring the microdevice to the target substrate.

18. The method according to claim 17, wherein along the direction perpendicular to the plane in which the substrate body extends, the second functional layer comprises a first surface and a second surface, and wherein the first surface is arranged on a side of the second functional layer close to the first functional layer, a distance between the second surface and the substrate body before the second functional layer protrudes is c1 and the distance after the second functional layer protrudes is c2, and the microdevice is L in height, wherein a difference between c2 and c1 is equal to c0, and c0 is greater than or equal to 0.5 L and less than or equal to 2 L.

19. A display panel, comprising:

a substrate; and a plurality of microdevices arranged on a side of the substrate, wherein the plurality of microdevices are transferred onto the substrate by the method for transferring a microdevice according to claim 17.

20. The display panel according to claim 19, wherein in a third direction, each of plurality of microdevices has a width of m, and the protrusion has a width of d, and d is greater than m, wherein the third direction is parallel to the plane in which the substrate body extends.

* * * * *